United States Patent
Tajima et al.

(10) Patent No.: US 9,593,240 B2
(45) Date of Patent: Mar. 14, 2017

(54) THERMOSETTING RESIN COMPOSITION

(71) Applicant: JNC CORPORATION, Tokyo (JP)

(72) Inventors: Akio Tajima, Kumamoto (JP); Takashi Matsuo, Kumamoto (JP); Kiichi Kawabata, Kumamoto (JP); Yoshiko Ueno, Kanagawa (JP); Koichi Ayama, Tokyo (JP)

(73) Assignee: JNC CORPORATION, Tokyo (JP)

( * ) Notice: Subject to any disclaimer, the term of this patent is extended or adjusted under 35 U.S.C. 154(b) by 8 days.

(21) Appl. No.: 14/442,403

(22) PCT Filed: Nov. 11, 2013

(86) PCT No.: PCT/JP2013/080448
§ 371 (c)(1),
(2) Date: May 13, 2015

(87) PCT Pub. No.: WO2014/077216
PCT Pub. Date: May 22, 2014

(65) Prior Publication Data
US 2016/0264779 A1    Sep. 15, 2016

(30) Foreign Application Priority Data

Nov. 13, 2012  (JP) .................................. 2012-249311

(51) Int. Cl.
| | |
|---|---|
| C08L 83/04 | (2006.01) |
| C08L 83/06 | (2006.01) |
| H01L 33/56 | (2010.01) |
| C08G 77/12 | (2006.01) |
| C08G 77/14 | (2006.01) |
| C08G 77/20 | (2006.01) |

(52) U.S. Cl.
CPC ............... *C08L 83/04* (2013.01); *C08L 83/06* (2013.01); *H01L 33/56* (2013.01); *C08G 77/12* (2013.01); *C08G 77/14* (2013.01); *C08G 77/20* (2013.01); *C08L 2203/206* (2013.01); *C08L 2205/025* (2013.01); *C08L 2205/05* (2013.01); *H01L 2924/0002* (2013.01)

(58) Field of Classification Search
CPC .......... C08G 77/12; C08G 77/20; C08L 83/00
See application file for complete search history.

(56) References Cited

U.S. PATENT DOCUMENTS

| | | |
|---|---|---|
| 2012/0149819 A1 | 6/2012 | Inoki et al. |
| 2012/0256325 A1 | 10/2012 | Kashiwagi et al. |
| 2013/0096249 A1* | 4/2013 | Kawabata ............ C08G 77/045 524/547 |
| 2013/0131264 A1 | 5/2013 | Nishimiya et al. |

FOREIGN PATENT DOCUMENTS

| | | |
|---|---|---|
| JP | 2003-252995 | 9/2003 |
| JP | 2010-280766 | 12/2010 |
| JP | 2012-12556 | 1/2012 |
| JP | 2012-102167 | 5/2012 |
| JP | 2012-219184 | 11/2012 |
| WO | 2004024741 | 3/2004 |
| WO | 2011 145638 | * 11/2011 |
| WO | 2011145638 | 11/2011 |
| WO | 2013005633 | 1/2013 |

OTHER PUBLICATIONS

"International Search Report (Form PCT/ISA/210)", mailed on Feb. 18,2014, pp. 1-4, in which five of the listed references (WO2013/005633, JP2012-12556, WO2011/145638, JP2012-219184 and JP2010-280766) were cited.

* cited by examiner

*Primary Examiner* — Kuo-Liang Peng
(74) *Attorney, Agent, or Firm* — Jianq Chyun IP Office

(57) ABSTRACT

The disclosure relates to the thermosetting resin composition containing (A) to (D):

(A) a thermosetting resin containing an SiH group and an alkenyl group, being a reaction product between silsesquioxane having an SiH group and an organopolysiloxane having two alkenyl groups;

(B) a thermosetting resin having an SiH group as obtained by allowing reaction among silsesquioxane having an SiH group, organopolysiloxane having two alkenyl groups, an epoxy compound having an alkenyl group and a silyl compound having an alkenyl group;

(C) a linear organopolysiloxane compound having an SiH group only at one terminal; and (D) a Pt catalyst.

14 Claims, No Drawings

THERMOSETTING RESIN COMPOSITION

CROSS-REFERENCE TO RELATED APPLICATION

This application is a 371 application of the International PCT application serial no. PCT/JP2013/080448, filed on Nov. 11, 2013, which claims the priority benefit of Japan application no. 2012-249311, filed on Nov. 13, 2012. The entirety of each of the above-mentioned patent applications is hereby incorporated by reference herein and made a part of this specification.

TECHNICAL FIELD

The present invention is contemplated for providing a thermosetting resin composition having both heat resistance and a high refractive index and containing a thermosetting resin formed of silsesquioxane and organopolysiloxane, and a hardened material obtained by hardening the thermosetting resin composition, a composition for an optical semiconductor, the composition containing the thermosetting resin composition, and an optical semiconductor device including the composition for the optical semiconductor.

BACKGROUND ART

A white LED has been used in an application such as illumination. However, heat generation from an LED package becomes a problem in connection with achieving high power. In the case where an epoxy resin is used for a sealing material, avoidance of yellowing due to the heat generation becomes quite difficult, and therefore a silicone resin has been used for the sealing material of the white LED in place of the epoxy resin. The silicone resin used for the LED is generally classified into two kinds including a phenyl silicone resin and a methyl silicone resin.

The phenyl silicone resin generally used therefor has a high refractive index and a good light-extraction efficiency. Moreover, the resin has a high gas barrier property and also a good adhesion with a package, and therefore has excellent reliability such as moisture-absorption reflow resistance and heat cycle resistance. However, while the resin is superior to the epoxy resin in resistance to thermal yellowing, the resin is far from sufficient in order to respond to achievement of high power of the LED.

The methyl silicone resin is superb in the resistance to thermal yellowing, but has a low refractive index, and therefore has a poor light-extraction efficiency from the LED. Moreover, the methyl silicone resin is mainly composed of dimethyl silicone, and therefore has a low gas barrier property, and also a poor adhesion with the package, and thus has had a problem of being easily peeled during moisture-absorption reflow. In a case where peeling is caused, brightness of light generated from the LED decreases, and therefore such a case is not preferred.

Further, a high power LED appears, and particularly when a package size is small, heat is locally accumulated in a resin portion, and a problem of causing cracks has come up. In a current-carrying test at a high temperature using the high power LED, a temperature in the resin portion is reputedly arrived at a high temperature region of 200° C. or higher, and therefore long-term reliability in the higher temperature region has been required.

In the high-temperature region, in the phenyl silicone resin generally used therefor, brightness degradation by yellowing is significant, and also the cracks are caused by resin deterioration. In the dimethyl silicone resin, although the brightness degradation by yellowing is low, the deterioration of the resin progresses in the high-temperature region, the cracks are caused, and the brightness is degraded, and therefore the resin is inapplicable to an application of the high power LED in several cases.

As described above, characteristics required for an LED sealing material becomes increasingly tough. Therefore, eager wish has been expressed for the sealing material that can respond to the high power of the white LED and achieve both the high refractive index and heat resistance, and further for the thermosetting resin composition having a balance regarding all of the moisture-absorption reflow resistance, the heat cycle resistance and so forth.

A silsesquioxane material having excellent heat resistance and UV resistance attracts attention, and the LED sealing material using such a material has been reported.

Patent literature No. 1 discloses an LED sealing material formed of a thermosetting resin composition by a thermosetting resin having cage silsesquioxane into which an SiH group is introduced, and organopolysiloxane having an alkenyl group.

Patent literature No. 2 discloses a thermosetting resin composition using imperfect cage silsesquioxane as commonly referred to as a double decker. The silsesquioxane is a compound obtained from hydrolytic condensation of phenyltrimethoxysilane, and a position of an Si-Ph group thereof is not random and is subjected to structure control, and therefore the silsesquioxane has excellent heat resistance and light resistance even with the high refractive index.

Patent literature No. 2 discloses a thermosetting resin containing an SiH group and a vinyl group as obtained from a reaction between a compound having a modified SiH group in a base of a silanol group of imperfect cage structure silsesquioxane, and organopolysiloxane having an alkenyl group. Then, a hardened material obtained by hardening the thermosetting resin is described to have the high heat resistance even with the high refractive index, and further a good adhesion with a polyphthalamide resin base material or a silver base material, being an LED package material.

CITATION LIST

Patent Literature

Patent literature No. 1: JP 2012-102167 A
Patent literature No. 2: WO 2011/145638 A

SUMMARY OF INVENTION

Technical Problem

Patent literature No. 1 describes only heat resistance (at 200° C.) of a thermosetting resin composition to give no description on characteristics required for an LED sealing material, such as adhesion with a base material, heat cycle resistance and moisture-absorption reflow resistance. Moreover, the composition is basically composed of a unit of —Me$_2$Si—O, and therefore a refractive index thereof is not high. As properties of the composition, the composition is a solid at a normal temperature, and is applicable to sealing of the LED according to a molding system, but inapplicable to sealing according to a dispenser system.

A hardened material using a thermosetting resin containing an SiH group and a vinyl group as obtained from a reaction between double decker silsesquioxane having four SiH groups and organopolysiloxane having two vinyl groups as described in Patent literature No. 2 has a problem of deterioration of adhesion performance when a content of the double decker silsesquioxane is low.

On the other hand, when the content of silsesquioxane is high, although the adhesion performance becomes high, the resin becomes excessively hard in several cases. As a result, no stress relaxation is allowed, resulting in having a problem of causing peeling from an LED package in a thermal shock test such as a heat cycle test. Further, in a wire-bonding type package system, the resin has a problem of easily causing wire cutting.

Moreover, when a sulfur-containing gas that exists in a use environment of LED lighting penetrates through an LED sealing resin, a silver plating surface of a lead frame, being an LED package substrate, is sulfurized and converted into silver sulfide. As a result, the silver plating surface is blackened to cause a problem of brightness deterioration.

The invention is contemplated for providing a thermosetting resin composition having all of heat resistance, UV resistance and a high refractive index, and the thermosetting resin composition having high adhesion, moisture-absorption reflow resistance and heat cycle resistance, and also improved sulfur resistance, and excellent reliability as an LED sealing agent.

Solution to Problem

The present inventors have diligently continued to conduct study so as to solve the problem. As a result, the present inventors have found that the problem can be solved by incorporating into a thermosetting resin composition a thermosetting resin containing an SiH group and an alkenyl group as obtained from a reaction between silsesquioxane having the SiH group and organopolysiloxane having two alkenyl groups, a thermosetting resin having an SiH group obtained by allowing reaction among silsesquioxane having an SiH group, organopolysiloxane having two alkenyl groups, an epoxy compound having an alkenyl group and a silyl compound having an alkenyl group, organopolysiloxane having an SiH group only at one terminal, and a Pt catalyst.

More specifically, the invention is as described below.

Item 1. A thermosetting resin composition containing (A) to (D) below:

(A) a thermosetting resin containing an SiH group and an alkenyl group, the thermosetting resin being a reaction product between silsesquioxane having the SiH group and organopolysiloxane having two alkenyl groups;

(B) a thermosetting resin having an SiH group obtained by allowing reaction among silsesquioxane having an SiH group, organopolysiloxane having two alkenyl groups, an epoxy compound having an alkenyl group and a silyl compound having an alkenyl group;

(C) a linear organopolysiloxane compound having an SiH group only at one terminal; and (D) a Pt catalyst.

Item 2. The thermosetting resin composition according to item 1, wherein the silsesquioxane is a double decker silsesquioxane.

Item 3. The thermosetting resin composition according to item 1 or 2, containing an organopolysiloxane compound (E) having two or more alkenyl groups when necessary.

Item 4. The thermosetting resin composition according to any one of items 1 to 3, wherein thermosetting resin (A) is a compound represented by formula (1) below:

Formula 1

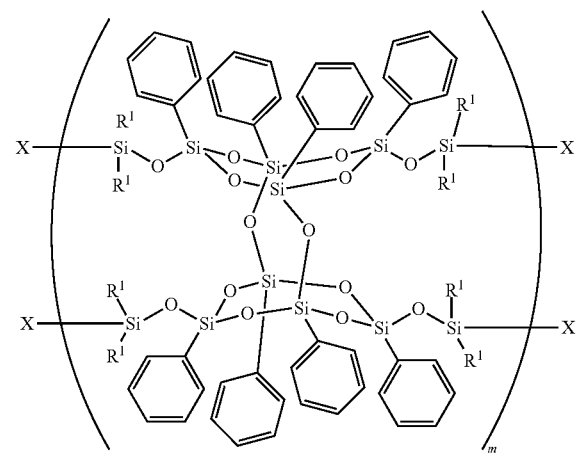

(1)

In formula (1), X is each independently a group represented by formula (X-I), formula (X-II) or formula (X-III) described below, and when the number of groups represented by formula (X-I) per molecule of the compound represented by formula (1) (average in one molecule of the compound when the compound is a mixture of compounds in which a ratio of a group represented by formula (X-I), a ratio of a group represented by formula (II) and a ratio of a group represented by formula (X-III) are different) is taken as a, the number of groups represented by formula (X-II) is taken as b, and the number of groups represented by formula (X-III) is taken as c, expressions: a+2b+c=4, 0<a≤3, 0≤b≤1 and 0<c≤3 hold.

$R^1$ is each independently a group selected from alkyl having 1 to 4 carbons, cyclopentyl and cyclohexyl, and m is a mean value satisfying 1 to 100.

Formula 2

(X-I)

Formula 3

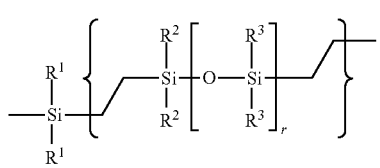
(X-II)

In formula (X-II), $R^2$ and $R^3$ are each independently a group selected from alkyl having 1 to 4 carbons, cyclopentyl, cyclohexyl and phenyl, r is the number of repetitions of —OSi($R^3$)$_2$—, and r is a mean value satisfying 2 to 20.

Formula 4

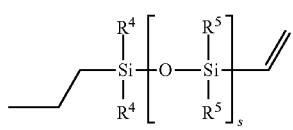
(X-III)

In formula (X-III), $R^4$ and $R^5$ are each independently a group selected from alkyl having 1 to 4 carbons, cyclopentyl, cyclohexyl and phenyl, s is the number of repetitions of —OSi($R^5$)$_2$—, and s is a mean value satisfying 2 to 20.

Item 5. The thermosetting resin composition according to any one of items 1 to 4, wherein thermosetting resin (B) is a compound represented by formula (B1) below.

Formula 5

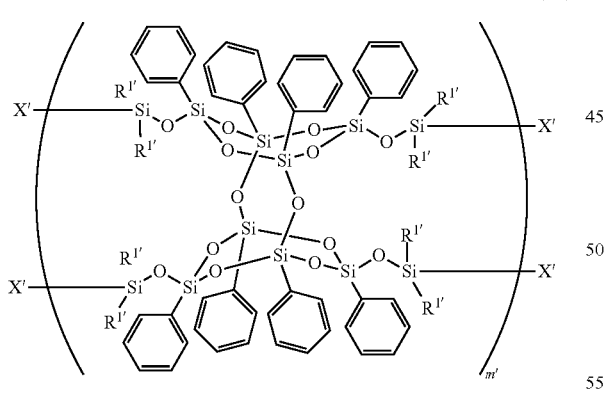
(B1)

In formula (B1), X' is each independently a group represented by formula (a), formula (b), formula (c-i), formula (c-ii), formula (c-iii), formula (d-i), formula (d-ii) or formula (d-iii) below, and when the number of groups represented by formula (a) is taken as A, the number of groups represented by formula (b) is taken as B, the number of groups represented by formula (c-i), formula (c-ii) or (c-iii) is taken as C, and the number of groups represented by formula (d-i), formula (d-ii) or formula (d-iii) as D per molecule of the compound represented by formula (1) (average in one molecule of the compound when the compound is a mixture of compounds in which a ratio of the group represented by formula (a) and ratios of the groups represented by formula (b) to formula (d-iii) are different), expressions: A+2B+C+D=4, 0.5≤A≤3.0, 0.5≤2B≤2.0, 0.1≤C≤2 and 0≤D≤1.0 hold.

$R^{1'}$ is each independently a group selected from alkyl having 1 to 4 carbons, cyclopentyl and cyclohexyl, and m' is a mean value satisfying 1 to 100.

Formula 6

(a)

Formula 7

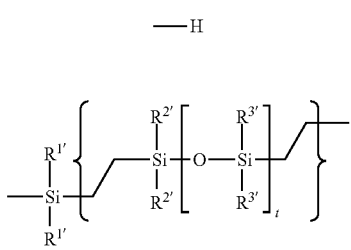
(b)

In formula (b), $R^{2'}$ and $R^{3'}$ are each independently a group selected from alkyl having 1 to 4 carbons, cyclopentyl, cyclohexyl and phenyl, and t is the number of repetitions of —OSi($R^{3'}$)$_2$—, and is a mean value satisfying 1 to 20.

Formula 8

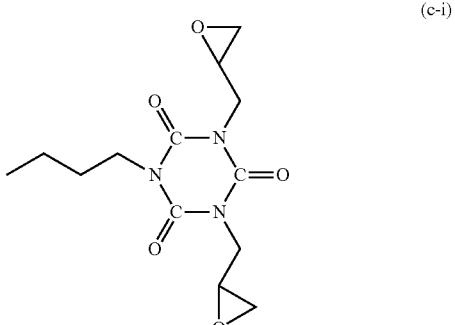
(c-i)

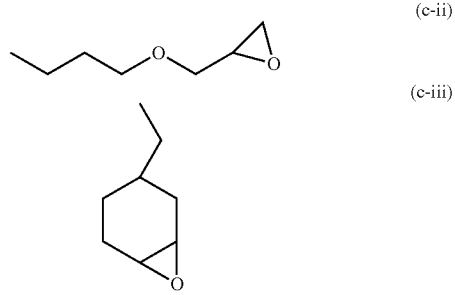
(c-ii)

(c-iii)

-continued

Formula 9

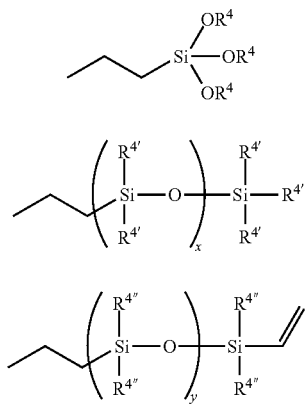

In formulas (d-i) to (d-iii), $R^4$, $R^{4'}$ and $R^{4''}$ are each independently a group selected from methyl, ethyl, butyl and isopropyl. Then, x is the number of repetitions of $-OSi(R^{4'})_2-$, and is a mean value satisfying 1 to 20. Further, y is the number of repetitions of $-OSi(R^{4''})_2-$, and is a mean value satisfying 1 to 10.

Item 6. The thermosetting resin composition according to any one of items 1 to 4, wherein thermosetting resin (B) is a compound represented by formula (B2) below:

Formula 10

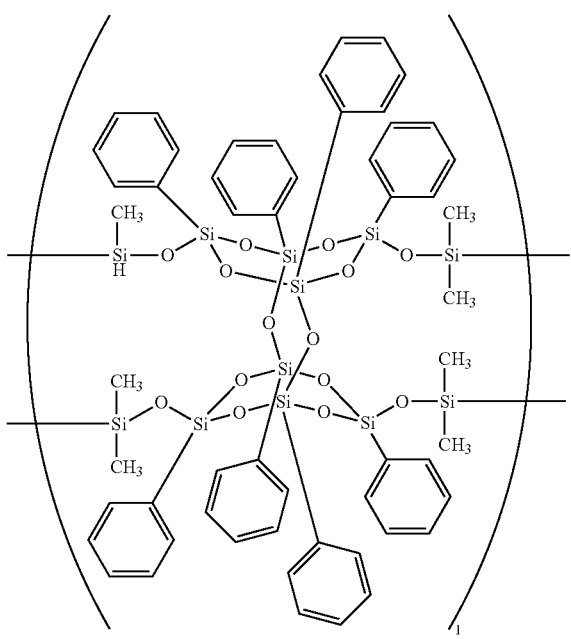

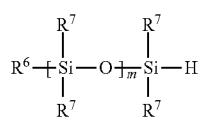

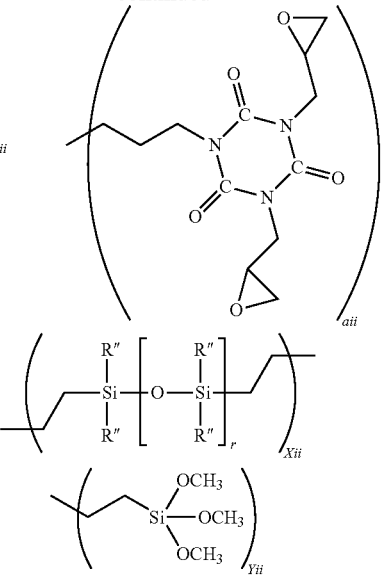

In formula (B2), R'' is each independently a group selected from alkyl having 1 to 4 carbons, cyclopentyl, cyclohexyl and phenyl, and r is an integer of 0 to 100. Further, aii is a subscript satisfying expressions: $0.1 \leq aii \leq 3.5$, Xii is a subscript satisfying expressions: $0 \leq 2Xii \leq 2.0$, Yii is a subscript satisfying expressions: $0 \leq Yii \leq 3.0$, and Zii is a subscript satisfying expressions: $0.1 \leq Zii \leq 3.5$.

Item 7. The thermosetting resin composition according to any one of items 1 to 6, wherein linear organopolysiloxane compound (C) having an SiH group only at one terminal is a compound represented by formula (2) below.

Formula 11

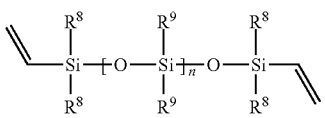

$R^6$ and $R^7$ are each independently a group selected from alkyl having 1 to 4 carbons, cyclopentyl and cyclohexyl, and m is the number of repetitions of $-OSi(R^7)_2-$, and is a mean value satisfying 1 to 20.

Item 8. The thermosetting resin composition according to any one of items 3 to 7, wherein organopolysiloxane compound (E) having two or more alkenyl groups is a compound represented by formula (3).

Formula 12

$$\overset{R^8}{\underset{R^8}{Si}}-\left[O-\overset{R^9}{\underset{R^9}{Si}}\right]_n-O-\overset{R^8}{\underset{R^8}{Si}}\diagdown \quad (3)$$

In formula (3), $R^8$ and $R^9$ are each independently a group selected from alkyl having 1 to 4 carbons, cyclopentyl, cyclohexyl and phenyl, and n is the number of repetitions of —OSi(R⁹)₂—, and is a mean value satisfying 1 to 50.

Item 9. The thermosetting resin composition according to any one of items 1 to 8, wherein a ratio of blending thermosetting resin (A) is 50 to 95% by mass, a ratio of blending thermosetting resin (B) is 1 to 50% by mass and a ratio of blending compound (C) is 2 to 20% by mass.

Item 10. The thermosetting resin composition according to any one of items 3 to 9, containing 1 to 10% by mass of organopolysiloxane compound (E) when necessary.

Item 11. The thermosetting resin composition according to any one of items 1 to 10, wherein at least one of silica and a phosphor is further dispersed thereinto.

Item 12. A hardened material, obtained by hardening the thermosetting resin composition according to any one of items 1 to 11.

Item 13. A composition for an optical semiconductor, containing the thermosetting resin composition according to any one of items 1 to 11.

Item 14. An optical semiconductor device, including as a sealing agent the composition for the optical semiconductor according to item 13.

Advantageous Effects of Invention

A hardened material obtained by hardening a thermosetting resin composition according to the invention can reduce hardness of the hardened material, while the material keeps advantages of a high refractive index and a high heat resistance, and an excellent adhesion performance. Therefore, the hardened material sealed with the thermosetting resin composition according to the invention has an excellent stress relaxation ability, and an optical semiconductor apparatus prepared using the thermosetting resin composition can be formed into the optical semiconductor apparatus that can withstand a severe reliability test. Furthermore, the apparatus is formed into the optical semiconductor apparatus that has a low surface tackiness even with a low hardness, can be diced, and is excellent also in shaping properties.

The thermosetting resin composition according to the invention has a silsesquioxane skeleton as a main component, and therefore the hardened material has an excellent heat resistance and also UV resistance. Furthermore, the hardened material exhibits an excellent adhesion with a housing base material such as a polyphthalamide resin, silver or ceramics, and can withstand a severe reliability test such as a moisture-absorption reflow test, a heat cycle test and a sulfur-resistance test and so forth.

Excellent characteristics of the thermosetting resin composition according to the invention are thought to be caused by capability of suppressing crosslinked density when an organopolysiloxane compound having an SiH group only at one terminal reacts with an alkenyl group of the thermosetting resin having an SiH group and an alkenyl group as a main agent, resulting in a material having a low hardness allowing stress relaxation, and also allowing no change in physical properties of a hardened resin itself in which, in the organopolysiloxane compound having the SiH group only at one terminal, only one terminal of the compound is bonded, and therefore a degree of freedom is high.

Further, the excellent characteristics of the thermosetting resin composition of the invention are thought to be caused by allowing the thermosetting resin to improve the adhesion with an interface of the housing base material for LED, in which the thermosetting resin having the SiH group is obtained by allowing reaction among the silsesquioxane having the SiH group, the organopolysiloxane having two alkenyl groups, the epoxy compound having the alkenyl group and the silyl compound having the alkenyl group.

DESCRIPTION OF EMBODIMENTS

The invention is described in detail below.

A thermosetting resin composition of the invention has features of containing (A) to (D) below.

(A) a thermosetting resin containing an SiH group and an alkenyl group, the thermosetting resin being a reaction product between silsesquioxane having the SiH group and organopolysiloxane having two alkenyl groups;

(B) a thermosetting resin having an SiH group obtained by allowing reaction among silsesquioxane having an SiH group, organopolysiloxane having two alkenyl groups, an epoxy compound having an alkenyl group and a silyl compound having an alkenyl group;

(C) a linear organopolysiloxane compound having an SiH group only at one terminal; and (D) a Pt catalyst.

Each component is described below.

(A) Thermosetting Resin Containing SiH Group and Alkenyl Group and Being Reaction Product of Silsesquioxane Having SiH Group and Organopolysiloxane Having Two Alkenyl Groups Thermosetting resin (A) is a reaction product between silsesquioxane having an SiH group, and organopolysiloxane having two alkenyl groups. Specific examples of the silsesquioxane having the SiH group include double decker silsesquioxane and cage silsesquioxane having T8 structure. While the cage silsesquioxane having T8 structure has eight functional groups, the double decker silsesquioxane used in the invention has only four functional groups, and is easy in controlling the structure. Moreover, as is different from complete condensation type cage silsesquioxane, the double decker silsesquioxane preferably used in the invention is an imperfect condensation type in which a degree of freedom of molecules thereof is comparatively high and is excellent in flexibility. From such a viewpoint, the double decker silsesquioxane is preferred.

Specific examples of thermosetting resin (A) include a compound represented by formula (1) below.

Formula 13

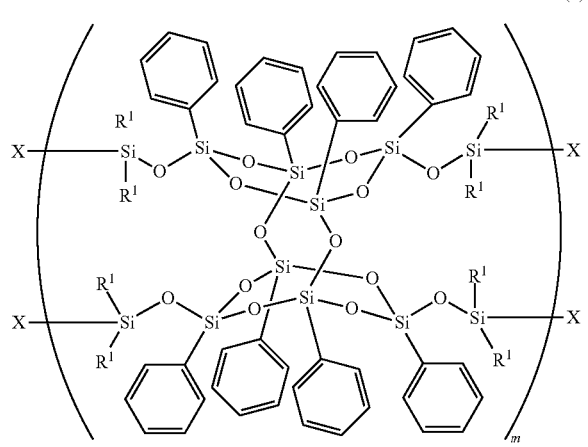

(1)

In formula (1), X is each independently a group represented by formula (X-I), formula (X-II) or formula (X-III) below. $R^1$ is each independently a group selected from alkyl having 1 to 4 carbons, cyclopentyl and cyclohexyl, and m is a mean value satisfying 1 to 100 and preferably 1.

Formula 14

(X-I)

Formula 15

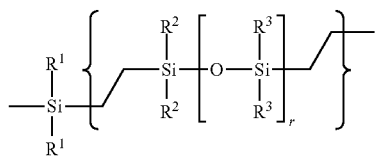
(X-II)

In formula (X-II), $R^2$ and $R^3$ are each independently a group selected from alkyl having 1 to 4 carbons, cyclopentyl, cyclohexyl and phenyl, r is the number of repetitions of —OSi($R^3$)$_2$—, and r is a mean value that fills 2 to 20. Then, r is preferably 2 to 10. $R^1$ is defined in a manner similar to the definitions in $R^1$ in formula (1).

Formula 16

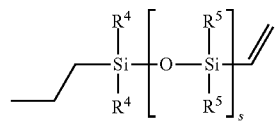
(X-III)

In formula (X-III), $R^4$ and $R^5$ are each independently a group selected from alkyl having 1 to 4 carbons, cyclopentyl, cyclohexyl and phenyl, s is the number of repetitions of —OSi($R^5$)$_2$—, and s is a mean value satisfying 2 to 20. Then, s is preferably 2 to 10, and further preferably 2 to 4.

When the number of groups represented by formula (X-I) per molecule of the compound represented by formula (1) (average in one molecule of the compound when the compound is a mixture of compounds in which a ratio of a group represented by formula (X-I), a ratio of a group represented by formula (II) and a ratio of a group represented by formula (X-III) are different) is taken as a, the number of groups represented by formula (X-II) is taken as b, and the number of groups represented by formula (X-III) is taken as c, expressions: a+2b+c=4, 0<a≤3, 0≤b≤1 and 0<c≤3 hold.

A compound in a range satisfying expressions: a+2b+c=4, 0<a≤3, 0≤b≤1 and 0<c≤3 in the invention is described.

If a>c, the compound represented by general formula (1) in which the number of SiH groups is larger than the number of vinyl groups on average, and can be defined as a so-called SiH group type thermosetting resin.

As the thermosetting resin (A), the SiH group type thermosetting resin is preferably used. From a viewpoint of significantly developing excellent characteristics upon forming a hardened material, the a is preferably 1.0 to 3.0, and further preferably 1.5 to 2.5. Then, a, b and c in the compound represented by general formula (1) can be adjusted at the discretion of the inventors, for example, according to the manufacturing method described in WO2011/145638 A.

The thermosetting resin composition of the invention preferably contains 50 to 95% by mass of the thermosetting resin (A), and further preferably 80 to 90% by mass, based on the total amount of the thermosetting resin composition. When a ratio of blending thermosetting resin (A) is adjusted to 80% by mass or more, characteristics of the double decker silsesquioxane, more specifically, heat resistance, UV resistance, a high refractive index and so forth can be retained. When the ratio of blending thermosetting resin (A) is adjusted to 95% by mass or less, hardness of the hardened material can be adjusted to D45 or less.

(B) Thermosetting Resin Having SiH Group and Being Obtained by Bringing Silsesquioxane Having SiH Group, Organopolysiloxane Having Two Alkenyl Groups, Epoxy Compound Having Alkenyl Group and Silyl Compound Having Alkenyl Group into Reaction Specific examples of thermosetting resin (B) having an SiH group obtained by allowing reaction among silsesquioxane having an SiH group, organopolysiloxane having two alkenyl groups, an epoxy compound having an alkenyl group and a silyl compound having an alkenyl group include a compound represented by formula (B1) below.

Formula 17

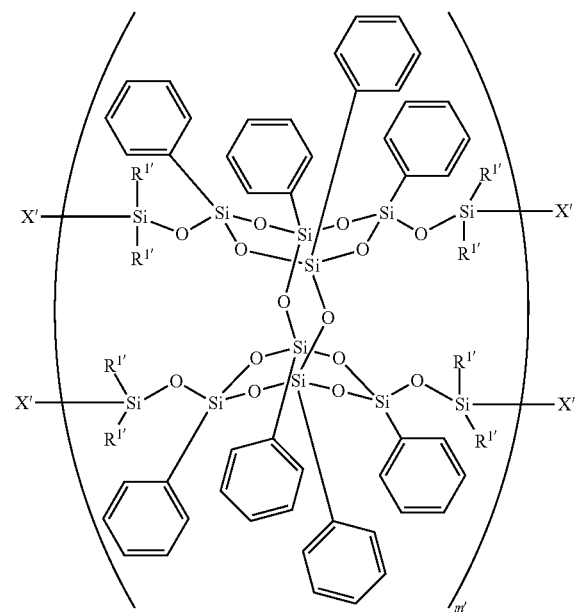
(B1)

In formula (B1), X' is each independently a group represented by formula (a), formula (b), formula (c-i), formula (c-ii), formula (c-iii), formula (d-i), formula (d-ii) or formula (d-iii) below, and when the number of groups represented by formula (a) is taken as A, the number of groups represented by formula (b) is taken as B,
the number of groups represented by formula (c-i), formula (c-ii) or (c-iii) is taken as C, and
the number of groups represented by formula (d-i), formula (d-ii) or formula (d-iii) as D per molecule of the compound represented by formula (1) (average in one molecule of the compound when the compound is a mixture of compounds in which a ratio of the group represented by formula (a) and ratios of the groups represented by formula (b) to formula (d-iii) are different), expressions: A+2B+C+D=4, 0.5≤A≤3.0, 0.5≤2B≤2.0, 0.1≤C≤2 and 0≤D≤1.0 hold.

$R^{1'}$ is each independently a group selected from alkyl having 1 to 4 carbons, cyclopentyl and cyclohexyl, and m' is a mean value satisfying 1 to 100.

Formula 18

(a)

Formula 19

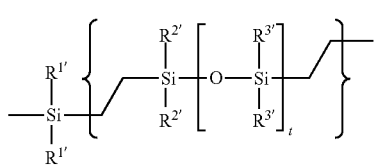
(b)

In formula (b), $R^{2'}$ and $R^{3'}$ are each independently a group selected from alkyl having 1 to 4 carbons, cyclopentyl, cyclohexyl and phenyl, t is the number of repetitions of —OSi($R^{3'}$)$_2$— and is a mean value satisfying 1 to 20.

Formula 20

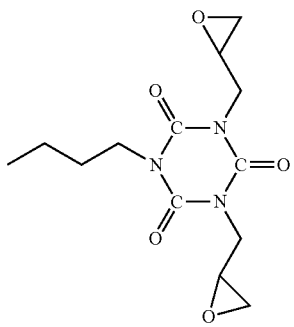
(c-i)

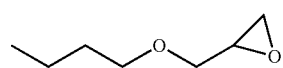
(c-ii)

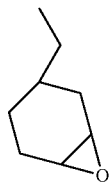
(c-iii)

Formula 21

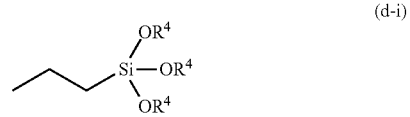
(d-i)

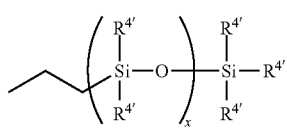
(d-ii)

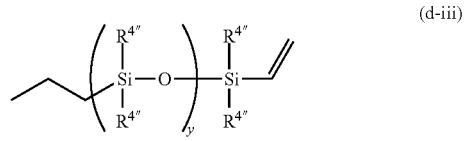
(d-iii)

In formulas (d-i) to (d-iii), $R^4$, $R^{4'}$ and $R^{4''}$ are each independently a group selected from methyl, ethyl, butyl and isopropyl. Then, x is the number of repetitions of —OSi($R^{4'}$)$_2$—, and is a mean value satisfying 1 to 20. Moreover, y is the number of repetitions of —OSi($R^{4''}$)$_2$—, and is a mean value satisfying 1 to 10.

A group represented by the formula (a) is derived from the silsesquioxane having the SiH group, and is an SiH-group residue formed after reaction is performed among a compound corresponding to a group represented by the formula (b), an epoxy derivative corresponding to a group represented by formulas (c-i) to (c-iii), and a compound corresponding to a group represented by formulas (d-i) to formula (d-iii) to be used when necessary. Therefore, the group represented by the formula (a) can react with the thermosetting resin being a reaction product between silsesquioxane and organopolysiloxane in which the compound of the invention is applied as an adhesion promoter, and therefore has a role of enhancing a function of the compound of the invention as the adhesion promoter.

The group represented by the formula (b) is a crosslinking component for silsesquioxane, and can provide the compound of the invention with flexibility. Specifically, the group takes a polymer structure as in a compound represented by formula (1-1) below.

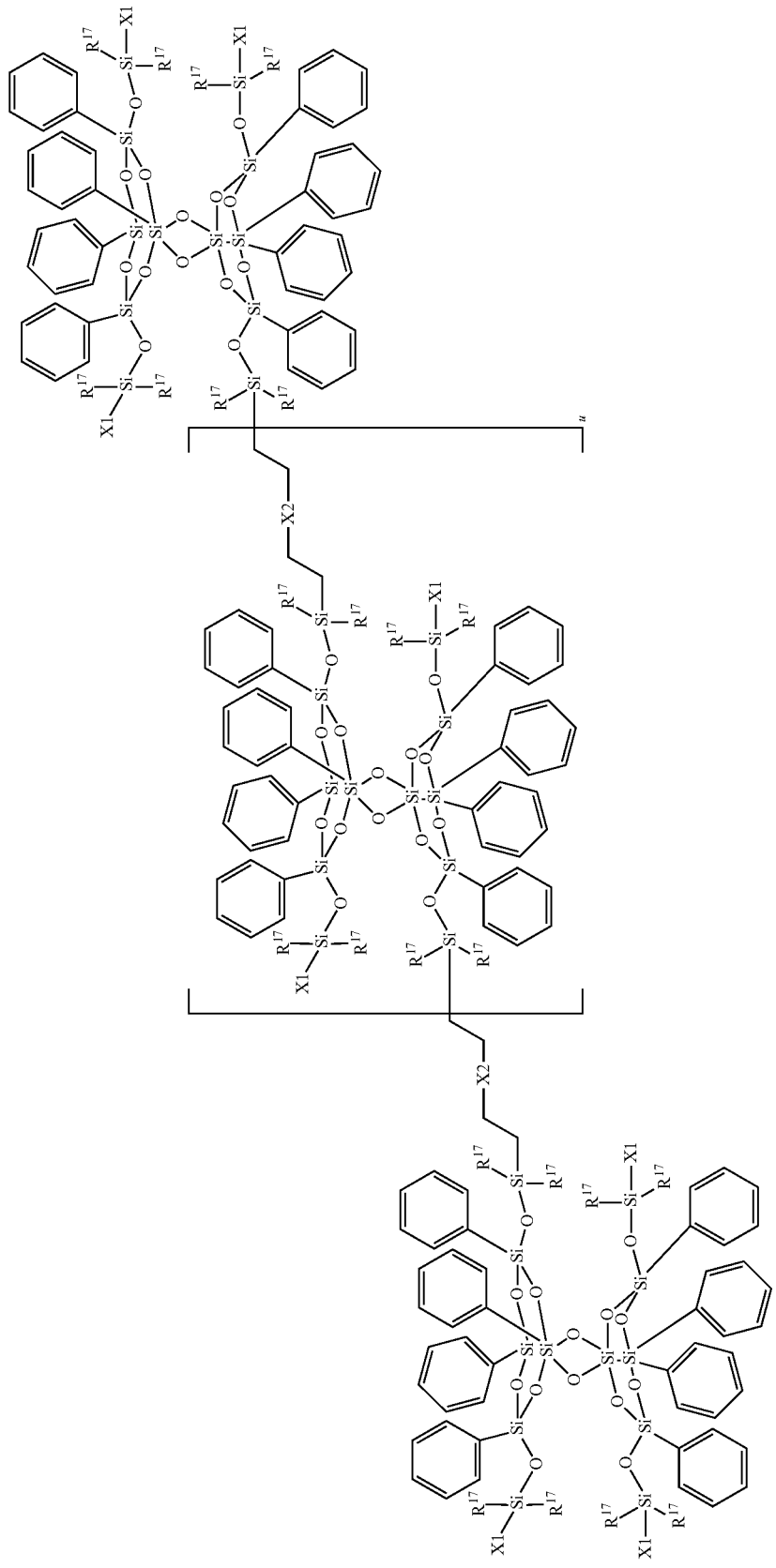
Formula 22

In formula (1-1), $X^1$ and $X^2$ are each independently a group represented by the formula (a), or formula (b) to formula (d-iii). $R^{17}$ is each independently a group selected from alkyl having 1 to 4 carbons, cyclopentyl, and cyclohexyl, and is preferably methyl. Further, u is a mean value satisfying 0 to 1,000.

As a value of B, being the number of the groups represented by formula (b), becomes larger, a component in which molecules are crosslinked with each other increases, and thus the compound of the invention is formed into a compound having a larger molecular weight. If B=0, the compound is in a state in which no crosslinking component exists. If B is in the range: 0<B<1, as the value of B becomes larger, the crosslinking component increases, and the molecular weight increases. If B is in the range: B>1, the compound is in a state in which crosslinking between the molecules with each other is significantly progressed to be formed into a gel form, and therefore the resulting compound is unusable as the thermosetting resin. The molecular weight of the compound of the invention can be adjusted by changing the value of B within the range: 0<B≤1.

Groups represented by formulas (c-i) to (c-iii) each are an epoxy group bonded with the SiH residue in a crosslinked body between the silsesquioxane and the organopolysiloxane, and has a role of improving adhesion with an LED housing base material. A component of (c-i) is a group having an isocyanuric ring skeleton in addition to the epoxy group, and has a role of improving also adhesion with metal.

Groups represented by formula (d-i) to formula (d-iii) each are an alkoxysilyl group, a trialkylsilyl group or a vinylsilyl group bonded with the SiH residue in the crosslinked body between the silsesquioxane and the organopolysiloxane.

A group represented by formula (d-i) below is derived from the (B), and is an arbitrary component. A group represented by formula (d-i) is used for the purpose of improving the adhesion with metal or compatibility with the resin.

Formula 23

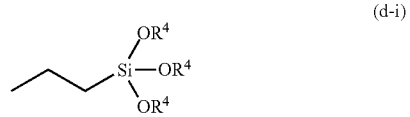

In formula (d-i), $R^4$ is each independently a group selected from methyl, ethyl, butyl and isopropyl.

A group represented by formula (d-ii) below is derived from the (B), and is an arbitrary component. The group represented by formula (d-ii) is used for the purpose of improving the compatibility with the resin, adjusting viscosity, or adjusting hardness after hardening a hardenable resin composition.

Formula 24

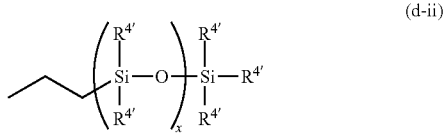

In formula (d-ii), $R^{4'}$ is each independently a group selected from methyl, ethyl, butyl and isopropyl, and is preferably methyl. Then, x is the number of repetitions of —OSi($R^{4'}$)$_2$—. Further, x is a mean value satisfying 1 to 20, and preferably a mean value satisfying 1 to 10.

A group represented by formula (d-iii) below is derived from the (B), and is an arbitrary component. The group represented by formula (d-iii) is used for the purpose of improving the compatibility with the resin, adjusting the viscosity, or adjusting the hardness after hardening the hardenable resin composition.

Formula 25

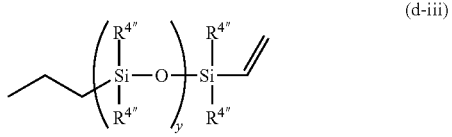

In formula (d-iii), $R^{4''}$ is each independently a group selected from methyl, ethyl, butyl and isopropyl, and is preferably methyl. Then, y is the number of repetitions of —OSi($R^{4''}$)$_2$—. Further, y is a mean value satisfying 1 to 10.

Further, expressions: A+2B+C+D=4, 0.5≤A≤3.0, 0.5≤2B≤2.0, 0.1≤C≤2, and 0≤D≤1.0 hold. Values from A to D can be arbitrarily adjusted according to properties of the thermoplastic resin composition to which the compound of the invention is applied as the adhesion promoter.

The group derived from the (B) is further described. A reaction reagent and a reaction method for obtaining the group represented by formula (d-ii) or formula (d-iii) are described.

First, the reaction reagent for obtaining the group represented by formula (d-ii) or the group represented by formula (d-iii) is described.

As shown in the reaction formula below, an equilibration reaction is performed to cyclic octamethyltetracyclosiloxane (D4) with divinyltetradisiloxane (DVDS) and hexamethyldisiloxane (MM) in excess moles in the presence of an acid catalyst to obtain an equilibrated mixture of compound a, compound b and compound c, and the mixture is used as the reaction reagent for obtaining the group represented by formula (d-ii) or the group represented by formula (d-iii).

Formula 26

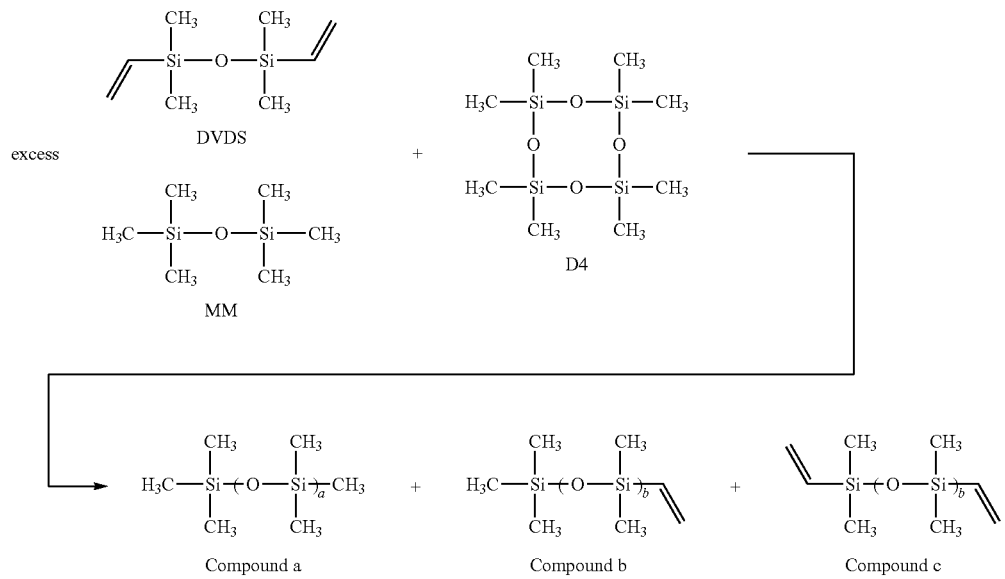

In the reaction formula, a is 1 to 20, b is 1 to 20, and c is 1 to 20.

A mole ratio in the reaction for a total mole of DVDS and MM to a mole D4 is preferably 2 or more. If the mole ratio is 2 or more, the molecular weight of a formed siloxane chain is low to form a component that can be removed by distillation, and in a purification step thereafter, removal of excessive compound a, compound b and compound c not involved in the reaction is facilitated.

The reaction method for obtaining the group represented by formula (d-ii) or formula (d-iii) is described.

As a reaction for forming the compound having the isocyanuric ring skeleton and also the epoxy group according to the invention, and providing the compound with the group represented by the formula (d-ii) or the formula (d-iii), a case where the group derived from the (B) is represented by formula (c-i) is described.

As shown in the reaction formula below, in a first step, a hydrosilylation reaction is allowed between DD-4H being a double decker compound having four SiH groups, and MA-DGIC being (c-i) to first obtain a compound having a group represented by formula (c-i). The compound represented by formula (c-i) is commercially available as MA-DGIC by Shikoku Chemicals Corporation. The compound DD-4H can be synthesized according to the method described in WO 2004/024741 A.

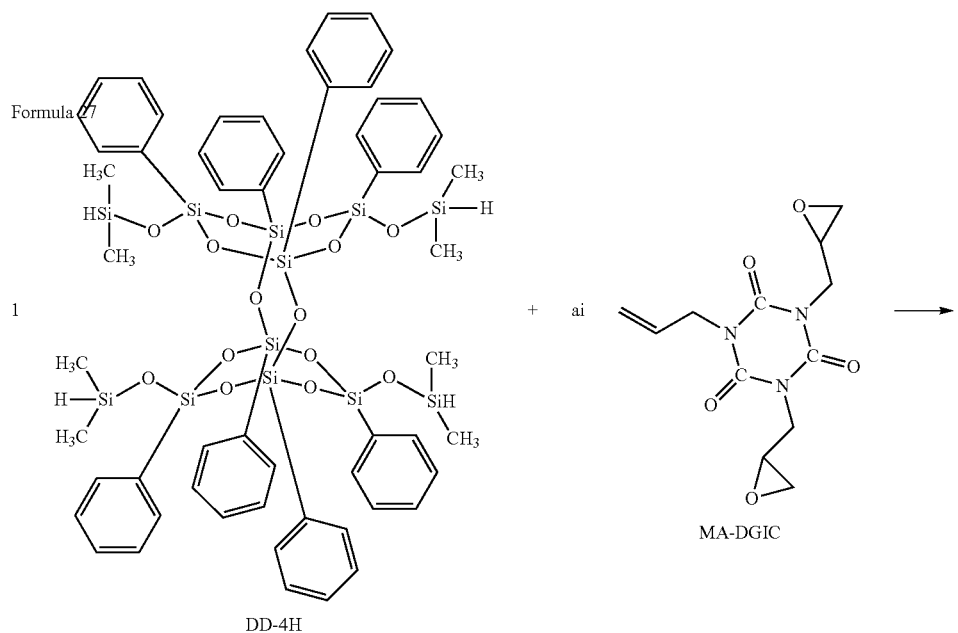

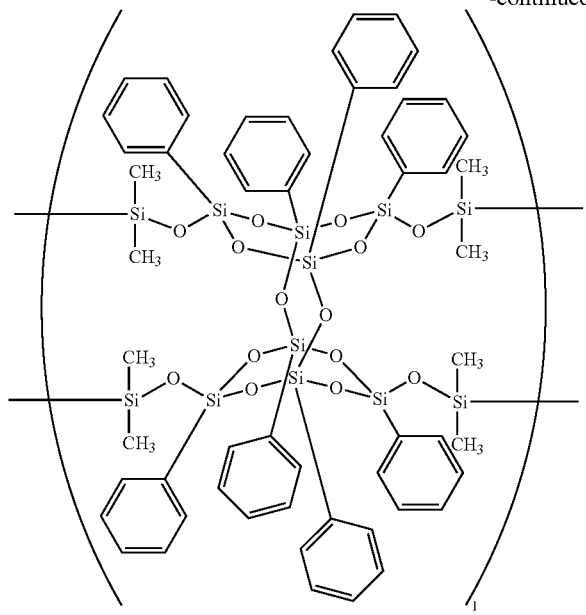 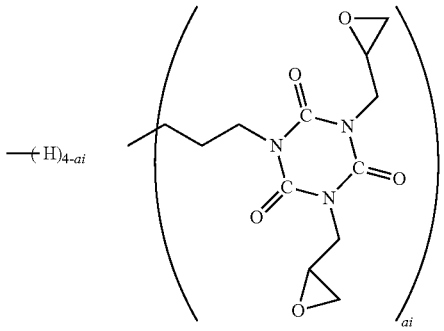

In the reaction formula, ai is 0.1 to 3.5.

Subsequently, as shown in the reaction formula below, in a reaction in a second step, a hydrosilylation reaction is allowed in such a manner in which the number of moles of the vinyl group in the mixture of the compound a, the compound b and the compound c becomes excessive to the number of moles of the SiH group in the compound in the first step to obtain the product below.

Formula 28
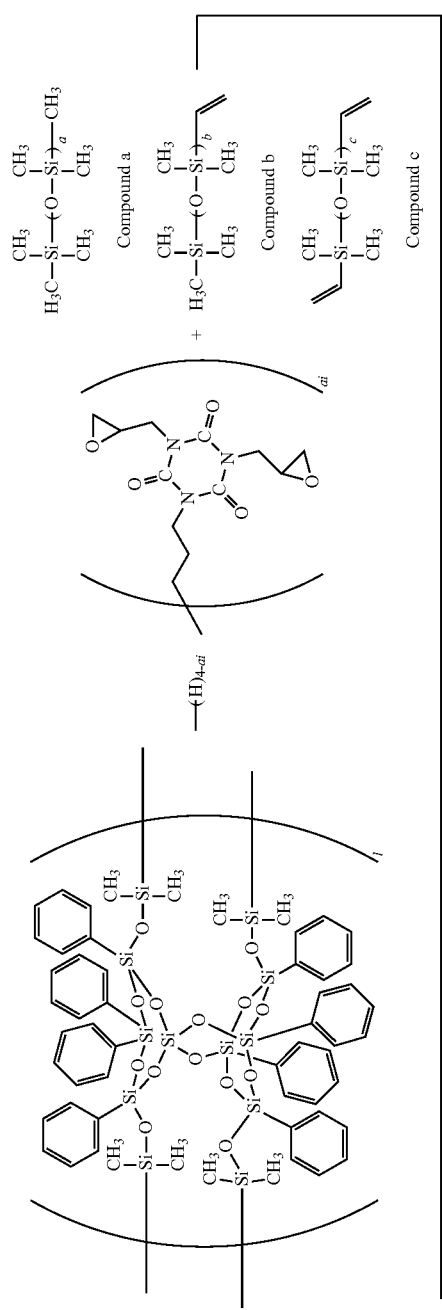
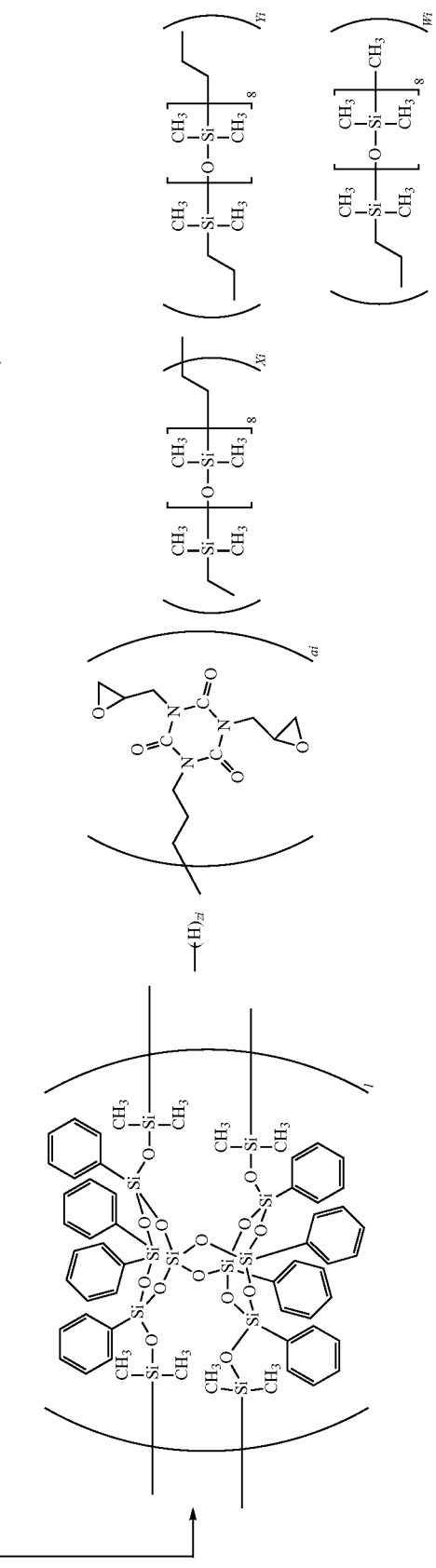

In the reaction formula, ai satisfies expressions: $0.1 \leq ai \leq 3.5$, Xi satisfies expressions: $0 \leq 2Xi \leq 2.0$, Yi satisfies expressions: $0 \leq Yi \leq 3.0$, Zi satisfies expressions: $0.1 \leq Zi \leq 3.5$, and Wi satisfies expressions: $0 \leq Wi \leq 3.0$.

The hydrosilylation reaction is allowed in such a manner in which the number of moles of the vinyl group becomes excessive, but a residual SiH group remains without being lost in a high temperature region of 100° C. or higher and further 120° C. or higher.

Excessive compound a, compound b and compound c not involved in the reaction can be distilled off by distillation using a thin film evaporator. Alternatively, the compounds can also be removed by a solvent extraction method. The compounds may also be left as it is at the discretion of inventors. The temperature in the case where the excessive compound a, compound b and compound c is distilled off by the distillation using the thin film evaporator is preferably in the range of 120° C. to 180° C., and operation pressure is preferably 0.13 kPa or less.

A preferred solvent for removing the excessive compound a, compound b and compound c in the solvent extraction method has a large dissolving power and a comparatively low boiling point. The preferred solvent is lower alcohol. A particularly preferred solvent is methanol. A further increase in a degree of purification only needs to increase the number of repetitions of operation of solvent extraction.

Next, a method for obtaining only the group represented by formula (d-iii) is described in detail.

As shown in the reaction formula below, the hydrosilylation reaction is first allowed between DD-4H and MA-DGIC in the reaction in the first step to first obtain a compound having a group represented by formula (c-i).

Formula 29

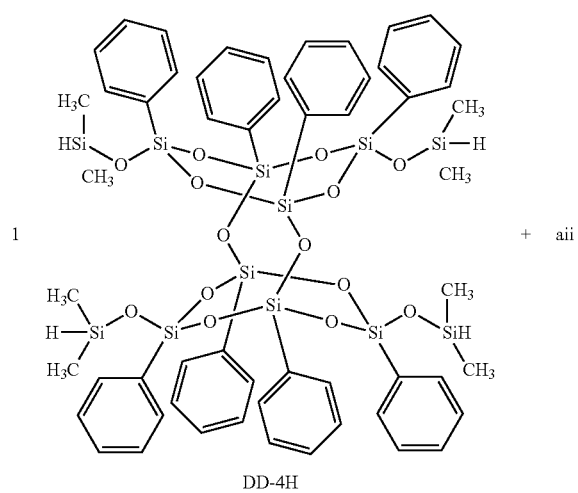

DD-4H

+ aii

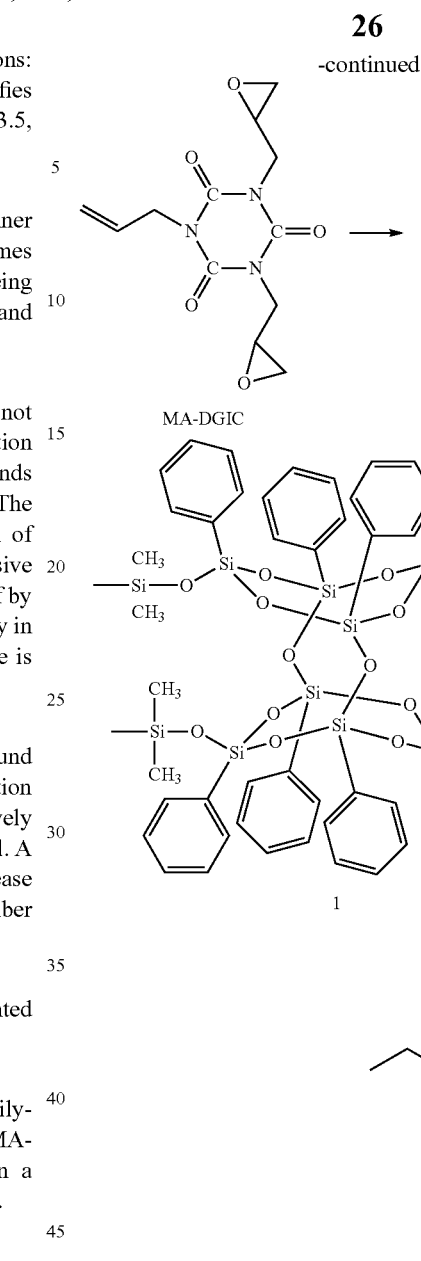

MA-DGIC

1 aii

In the reaction formula, aii is in the range: $0.1 \leq aii \leq 3.5$.

A reactant used in the reaction in the second step is represented by formula (F).

Formula 30

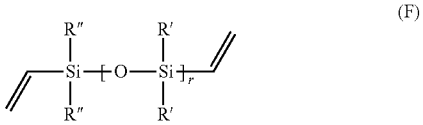

(F)

In formula (F), R' and R" are each independently a group selected from alkyl having 1 to 4 carbons, cyclopentyl, cyclohexyl and phenyl, and r is an integer of 0 to 100. R' and R" are preferably methyl. Further, r is preferably 1 to 100, and further preferably 2 to 20.

As shown in the reaction formula below, a hydrosilylation reaction is allowed in such a manner in which the number of moles of the vinyl group in the compound represented by (F) becomes excessive to the number of moles of the SiH group in the compound in the first step.

Formula 31

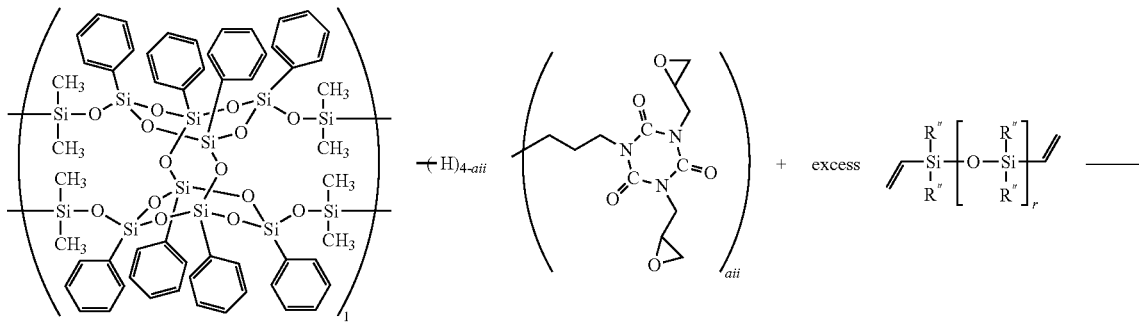

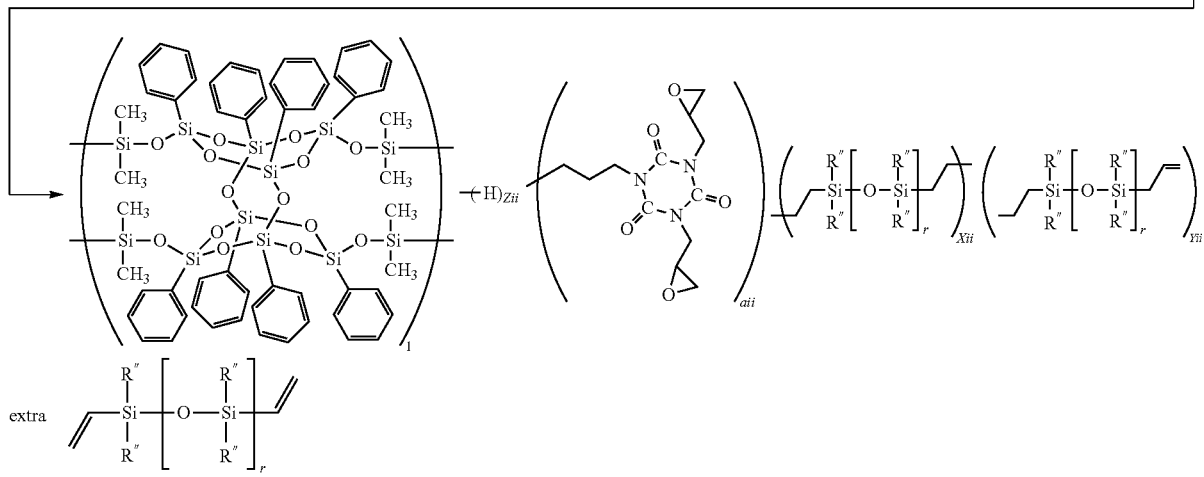

In the reaction formula, aii satisfies expressions: $0.1 \leq aii \leq 3.5$, Xii satisfies expressions: $0 \leq 2Xii \leq 2.0$, Yii satisfies expressions: $0 \leq Yii \leq 3.0$, Zii satisfies expressions: $0.1 \leq Zii \leq 3.5$, and r is 1 to 20.

The hydrosilylation reaction is allowed in such a manner in which the number of moles of the vinyl group of the compound represented by the formula (F) becomes excessive, but a residual SiH group remains without being lost in a high temperature region of 100° C. or higher and further 120° C. or higher.

Excessive organopolysiloxane not involved in the reaction is the compound having the vinyl group, and therefore may be allowed to remain as it is as a resin component that can be thermally hardened, or may be appropriately removed by solvent extraction or the like. A preferred solvent for removing the excessive organopolysiloxane has a large dissolving power and a comparatively low boiling point. A preferred solvent is lower alcohol. A particularly preferred solvent is methanol. A further increase in a degree of purification only needs to increase the number of repetitions of operation of solvent extraction.

Moreover, specific examples of thermosetting resin (B) having the SiH group include a compound represented by formula (B-2) below.

Formula 32

(B2)

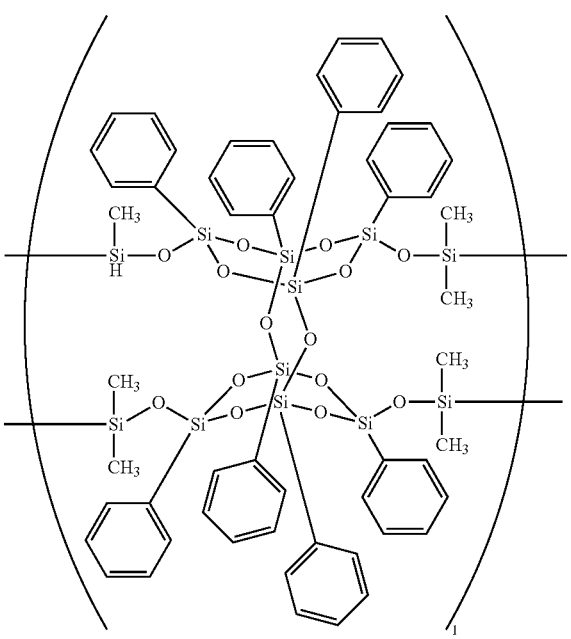

-continued

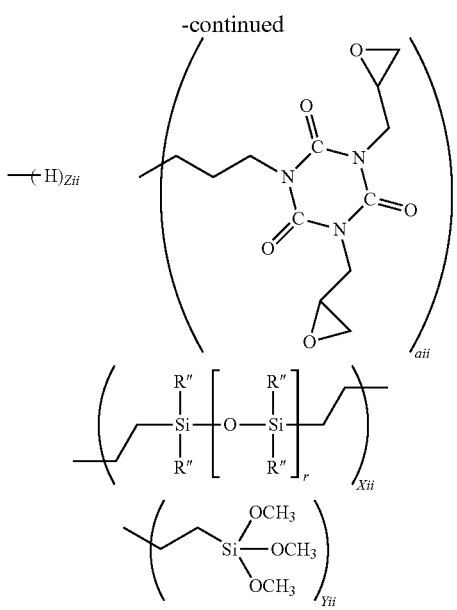

In formula (B-2), R'' is each independently a group selected from alkyl having 1 to 4 carbons, cyclopentyl, cyclohexyl and phenyl, and r is an integer of 0 to 100. Then, aii satisfies expressions: 0.1≤aii≤3.5, Xii satisfies expressions: 0≤2Xii≤2.0, Yii satisfies expressions: 0≤Yii≤3.0, and Zii satisfies expressions: 0.1≤Zii≤3.5.

The thermosetting resin composition of the invention preferably contains thermosetting resin (B) having the SiH group in an amount of preferably 1 to 50% by mass, and further preferably 2 to 15% by mass, based on the total amount of the thermosetting resin composition. Adhesion strength with the LED housing base material can be increased by adjusting a ratio of blending thermosetting resin (B) having the SiH group to 1% by mass or more.

In addition, an epoxy part in the thermosetting resin (B) having the SiH group can be arbitrarily used, and therefore the thermosetting resin (B) is contained in a mass part to be preferably in the range of 0.01 to 10% by mass, and further preferably 0.05 to 5% by mass in a total of the epoxy part, based on the total amount of thermosetting resin composition.

(C) Linear Organopolysiloxane Compound Having SiH Group Only at One Terminal

Specific examples of linear organopolysiloxane compound having the SiH group only at one terminal (C) include a compound represented by the formula (2) below.

Formula 33

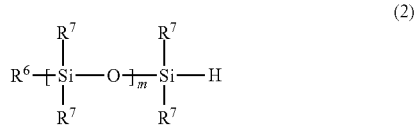

(2)

In formula (2), $R^6$ and $R^7$ are each independently a group selected from alkyl having 1 to 4 carbons, cyclopentyl and cyclohexyl, and methyl or butyl is preferred. Then, m is the number of repetitions of $-OSi(R^7)_2-$. Further, m is a mean value satisfying 1 to 20, and is preferably a mean value satisfying 2 to 15.

Then, (C) being the organopolysiloxane compound is used for reducing the hardness. More specifically, (C) can be reacted with the alkenyl group of the thermosetting resin (A) to decrease crosslinked density as a whole, and thus low hardness can be achieved.

As an amount of blending (C) is larger, the hardness of a hardened material can be decreased. A content of (C) in the thermosetting resin composition of the invention is preferably in a range in which a refractive index of the hardened material can be kept at 1.5 or more. Light-extraction efficiency as an LED sealing agent can be improved, and adhesion can be improved by adjusting the content at a level at which the refractive index of the hardened material can be kept at 1.5 or more.

The number average molecular weight of (C) is preferably in the range of 148 to 2,000, and further preferably in the range of 400 to 1,000. When the number average molecular weight of (C) is 400 or less, volatility becomes higher, and (C) is likely to be volatilized in a step of blending a hardening composition and hardening the composition, and therefore the number average molecular weight of 400 or more is further preferred.

Moreover, when the number average molecular weight of (C) is adjusted to be 2,000 or less, the compatibility with the thermosetting resin can be kept, in which the thermosetting resin is the reaction product between the silsesquioxane having the SiH group and the organopolysiloxane having two alkenyl groups, and contains the SiH group and the alkenyl group, transparency of the hardened material can be kept and the adhesion can be kept.

A ratio of blending (C) is preferably adjusted to 2 to 20% by mass, and further preferably 5 to 15% by mass in the total thermosetting resin composition of the invention. The hardness of the hardened material can be decreased to D45 or less by adjusting the ratio of blending (C) to 2% by mass. A hardened material having low hardness can be effectively obtained while various characteristics such as the heat resistance, the UV resistance and the adhesion of the hardened material are retained by adjusting the ratio of blending (C) to 20% by mass or less.

(D) Pt Catalyst

Pt catalyst (D) contains platinum, and the platinum may be unoxidized or oxidized. Specific examples of oxidized platinum include platinum oxide. Specific examples of partially oxidized platinum include an Adam's catalyst.

Specific examples of the Pt catalyst include a Karstedt catalyst, a Speier catalyst and hexachloroplatinic acid. The catalysts are generally well known. Among the catalysts, the Karstedt catalyst of an unoxidized type is preferably used.

A ratio of blending Pt catalyst (D) in the total thermosetting resin composition of the invention is preferably sufficient to promote hardening of the thermosetting resin composition of the invention, and specifically, is adjusted to the range of preferably 0.01 ppm to 10 ppm, and further preferably 0.1 ppm to 1 ppm.

When the ratio of blending Pt catalyst (D) is adjusted to 0.01 ppm or more, hardening can be promoted. When the ratio of blending Pt catalyst (D) is adjusted to 0.1 ppm or more, hardening can be quickly promoted. Moreover, when the ratio of blending Pt catalyst (D) is adjusted to 10 ppm or more, the heat resistance of the hardened material can be retained.

(E) Organosiloxane Compound Having Two or More Alkenyl Groups

The thermosetting resin composition of the invention may contain, when necessary, an organosiloxane compound having two or more alkenyl groups (E). Specific examples of the organopolysiloxane having two or more alkenyl groups according to the invention include a compound represented by a general formula described below.

Formula 34

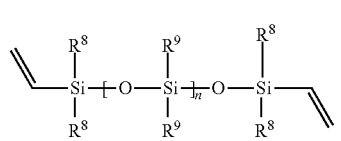

(3)

In formula (3), $R^8$ and $R^9$ are each independently groups selected from alkyl having 1 to 4 carbons, cyclopentyl, cyclohexyl and phenyl, and n is the number of repetitions of —OSi($R^9$)$_2$—, and is a mean value satisfying 1 to 50.

Organopolysiloxane compound (E) is a component for adjusting viscosity of the hardening composition of the invention, and for or for supplementarily providing strength or flexibility for the hardened material. When all of $R^8$ and $R^9$ are alkyl having 1 to 4 carbons in formula (3), methyl is preferably used, and organopolysiloxane compound (E) is represented by the general formula (4) below.

Formula 35

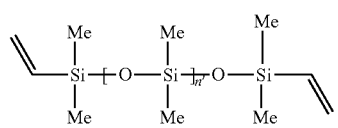

(4)

In formula (4), n' is a mean value satisfying 1 to 20. In a case where n' is 20 or less, the compatibility with the hardening composition of the invention becomes satisfactory, and such a case is preferred. In the meaning of providing the hardened material with the flexibility, n' is preferably 5 or more, and from a viewpoint of gas barrier, n' is preferably 10 or less. From viewpoints of the flexibility and the gas barrier, n' is particularly preferably 5 to 8.

Moreover, a compound represented by general formula (5) or (6) below in which at least part of $R^8$ and $R^9$ in formula (3) is a phenyl group can also be appropriately used.

Formula 36

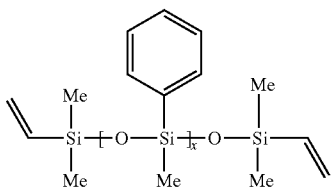

(5)

In formula (5), x is a mean value satisfying 1 to 50, and is preferably 1 to 20.

Formula 37

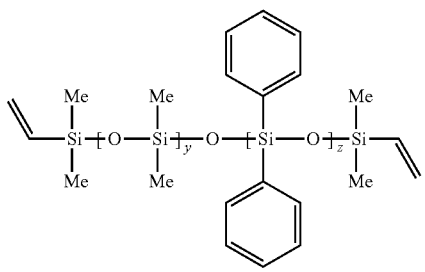

(6)

In formula (6), (y+z) is a mean value satisfying 1 to 50, and from a viewpoint of the refractive index and the gas barrier, preferably satisfies expressions: y/(y+z)<0.5. In the meaning of providing the hardened material with the flexibility, (y+z) is preferably 10 or more.

Organosiloxane compounds (E) having two or more alkenyl groups may be used in combination at the discretion of inventors.

Organosiloxane compound (E) can be prepared by a known conventional method. For example, the organosiloxane compound represented by formula (4) can be prepared by allowing an equilibration reaction of tetramethylvinyldisiloxane with octamethylcyclotetrasiloxane in the presence of a solid acid catalyst such as activated clay, and then removing the solid acid catalyst by filtration, and then cutting a low-boiling portion under conditions of vacuum of about 0.13 kPa and under conditions of a temperature in the range from 100 to 120° C. The organosiloxane compound represented by formula (5) or formula (6) can be prepared by a known conventional method. Moreover, the organosiloxane compound represented by formula (5) or formula (6) is industrially available from GELEST, Inc.

A ratio of blending organosiloxane compound (E) is preferably adjusted to 10% by mass or less in the total thermosetting resin composition of the invention. When the ratio of blending organosiloxane compound (E) is adjusted to 10% by mass or less, the heat resistance is improved and resin strength increases, and therefore such a ratio is preferred.

In the thermosetting resin composition of the invention, a component described below may be further blended.

(i) Hardening Retarder

As a hardening retarder, a known retarder used in an addition type hardening composition using a hydrosilylation catalyst can be used. Specific examples include a compound containing two or more alkenyl groups, a compound containing an aliphatic unsaturated bond, an organic phosphorous compound, a tin-based compound and an organic peroxide. The retarders may be used alone or in combination of two or more kinds.

Specific examples of the compound containing two or more alkenyl groups include disiloxane having vinyl groups at both terminals, trisiloxanes and vinyl group-containing cyclic cyclosiloxanes such as 1,3,5,7-tetravinyltetramethyl-cyclotetrasiloxane.

Specific examples of the compound containing the aliphatic unsaturated bond include propargyl alcohols such as 3-methyl-1-dodecyne-3-ol, 3,5-dimethyl-1-hexyn-3-ol, 1-ethynyl-1-cyclohexanol, ene-yn compounds, maleic anhydride and maleates such as dimethyl maleate.

Specific examples of the organic phosphorous compound include triorganophosphines, diorganophosphines, organophosphones and triorganophosphites.

Specific examples of the tin-based compound include stannous halide dihydrate and stannous carboxylate. Moreover, specific examples of the organic peroxide include di-t-butyl peroxide, dicumyl peroxide, benzoyl peroxide and t-butyl perbenzoate.

Among the retarders, 1,3-divinyl disiloxane, 1,3,5,7-tetravinyl tetramethyl cyclotetrasiloxane or 1-ethynyl-1-cyclohexanol is preferred.

When the hardening retarder is blended with the thermosetting resin composition of the invention, a rise of viscosity at room temperature can be suppressed, and also a pot life thereof can be prolonged. A content of the hardening retarder in the thermosetting resin composition of the invention is preferably 0.001 to 0.1% by mass, and further preferably, 0.01 to 0.05% by mass.

(ii) Phosphor

A phosphor is dispersed into the thermosetting resin composition according to the invention, thereby having a light-emitting function, and allowing use as an LED composition. A content of the phosphor in the thermosetting resin composition according to the invention is preferably 1 to 90% by mass, and further preferably, 2 to 50% by mass.

The phosphor that can be used in the thermosetting resin composition according to the invention is not restricted. Moreover, a concentration distribution of the phosphor in the composition may be uniform or different. A kind of the phosphor to be used, presence or absence of the concentration distribution of the phosphor, and conditions of the distribution may be determined according to a use environment, an application or a purpose of the LED.

(iii) Silica

In the thermosetting resin composition according to the invention, silica may be added for a purpose of improvement in the resin strength or preventing sedimentation of the phosphor. A ratio of silica in the thermosetting resin composition according to the invention is preferably 1 to 40%, further preferably 1 to 20% and further preferably 1 to 10% in terms of a weight ratio based on the total amount of the thermosetting resin composition.

As silica, a product obtained by grinding naturally occurring silica stone (natural silica) into fine power may be used, or industrially synthesized silica (synthetic silica) may also be used. In the case of the natural silica, the silica is crystalline, and therefore has a crystal axis. Accordingly, while optical features derived from a crystal may be expected, specific gravity thereof is slightly higher in comparison with the synthetic silica, and therefore dispersion into the thermosetting resin composition may be influenced. When a natural product is pulverized to obtain the silica, the resulting material may be formed into particles having indefinite shape or a material having a broad particle size distribution.

The synthetic silica includes wet synthetic silica and dry synthetic silica, but use thereof is not particularly limited in the invention. However, the synthetic silica may have water of crystallization without regard to preparation processes in several cases. When the water of crystallization may have a somewhat influence on the thermosetting resin composition, the hardened material, the LED element, or the like, the synthetic silica is preferably selected in consideration of the number of water of crystallization.

The synthetic silica is amorphous, and not crystalline, and therefore has no crystal axis, and particular optical features derived from the crystal are unexpectable. However, the synthetic silica can take advantage of features of capability of significantly reducing a particle size in addition to control of a particle distribution.

In particular, fumed silica has a particle size in a nano order, and is excellent in dispersibility of the particles. Further, when comparison is made in identical weight, as the particle size is smaller, a sum of surface areas becomes larger, and thus a direction of light reflection is further diversified, and therefore such fumed silica can be further preferably used.

Moreover, the silica generally has a large surface area and is a hydrophilic material (hydrophilic silica) due to an effect of silanol existing on the surface, but can be processed into hydrophobic silica by chemical modification. Use of silica having either properties is selected according to a purpose, but in the invention, use of hydrophilic silica is preferred in experimental verification.

A method for manufacturing the thermosetting resin composition according to the invention is not particularly limited, and specific examples include a method in which a mixer such as a homodisper, a homo mixer, a universal mixer, a planetary mixer, a kneader, a three-roll, and a bead mill is used, and under ordinary temperature or warming, the silicone resin as described above, and when necessary, a thermosetting agent, an antioxidant or the like as described above in a predetermined amount for each are mixed.

An application of the thermosetting resin composition or the hardened material thereof according to the invention is not particularly limited, but can be used, for example, as a sealing agent, a housing material, a die bonding material for connecting with a lead electrode or a heat sink, an underfill material when a light-emitting device of an optical semiconductor device, such as a light-emitting diode, is subjected to flip chip mounting, or a passivation film on the light-emitting device. Above all, the optical semiconductor apparatus that can efficiently extract light by light emission from the optical semiconductor device can be manufactured, and thus the composition can be preferably used as the sealing agent, the underfill material or the die bonding material.

As conditions under which the thermosetting resin composition according to the invention is hardened by heating to obtain the hardened material, temperature is preferably in the range of 60 to 200° C., and further preferably, in the range of 80 to 160° C. Moreover, a period of time is preferably in the range of 1 to 24 hours, and further preferably, in the range of 2 to 5 hours.

The hardness of the hardened material obtained by hardening the thermosetting resin composition according to the invention is preferably in the range of 45 or less in terms of D hardness, or 30 or more in terms of A hardness. As the refractive index thereof, a high refractive index of 1.5 or more is preferred. When the refractive index is 1.5 or more, the hardened material excellent in the optical extraction efficiency from the LED is formed.

A method for sealing the light-emitting device using the composition for the optical semiconductor according to the invention is not particularly limited, and specific examples include a method for preliminarily injecting the composition for the optical semiconductor according to the invention into a mold form, and dipping a lead frame or the like to which the light-emitting device is fixed, and then hardening the composition, and a method for injecting the composition for the optical semiconductor according to the invention into a form in which a light-emitting device is inserted and then hardening the composition.

Specific examples of the method for injecting the composition for the optical semiconductor thereinto according to the invention include injection by a dispenser, transfer molding and injection molding. Further, specific examples of other sealing methods include a method of adding dropwise the composition for the optical semiconductor according to the invention onto a light-emitting device, applying the composition thereon by stencilling, screen printing and application through a mask to harden the composition, and a method of injecting by a dispenser the composition for the optical semiconductor according to the invention into a cup in which a light-emitting device is arranged at a bottom thereof, and hardening the composition.

The optical semiconductor device including the composition for the optical semiconductor device according to the invention as the sealing agent is also one aspect of the invention.

Examples

The invention is described in greater detail by way of Examples. In addition, the invention is not limited by the Examples described below.

Measurement of Number Average Molecular Weight and Weight Average Molecular Weight The number average molecular weight of a polymer synthesized in the invention was measured as described below.

High performance liquid chromatograph system CO-2065 plus made by JASCO Corporation was used, 20 microliters of THF solution of a sample having a concentration of 1% by mass was used as an analytical sample, and measurement was carried out according to a GPC method under conditions of column: Shodex KF804L (made by Showa Denko K.K.) (two columns being connected in series), column temperature: 40° C., a detector: RI, an eluate: THF, and an eluate flow rate: 1.0 mL per minute to calculate a polystyrene equivalent, and thus the molecular weight was determined.

Reagents used in Examples are as described below.

FM-2205 (polydimethylsiloxane having vinyl groups at both terminals, and the number average molecular weight of 700): MA-DGIC (monoallyldiglycidyl isocyanurate): made by Shikoku Chemicals Corporation; and S210(vinyltrimethoxysilane): made by JNC Corporation.

(A) Thermosetting Resin Containing SiH Group and Alkenyl Group, Being Reaction Product Between Silsesquioxane Having SiH Group and Organopolysiloxane Having Two Alkenyl Groups As the thermosetting resin containing an SiH group and an alkenyl group, being component (A) of the invention, silsesquioxane derivative base polymer 1 or silsesquioxane derivative base polymer 2 prepared by the method disclosed in WO2011/145638 A was used.

Silsesquioxane Derivative Base Polymer 1

A compound represented by a chemical formula below in which a (in formula (X-I)) is 2.34, b (in formula (X-II)) is 0, and c (in formula (X-III)) is 1.66 in the formula (1) was taken as silsesquioxane derivative base polymer 1.

Formula 38

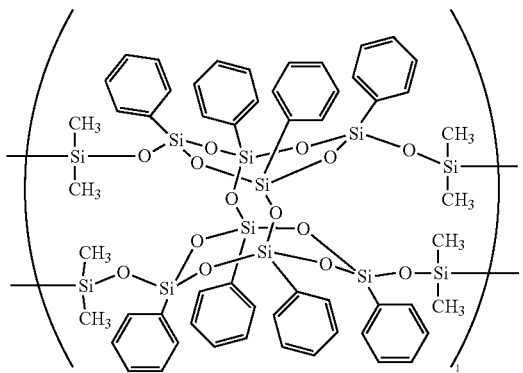

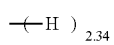

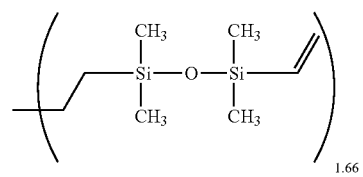

Silsesquioxane Derivative Base Polymer 2

A compound represented by a chemical formula below in which a (in formula (X-I)) is 2.37, 2b (in formula (X-II)) is 0.48, and c (in formula (X-III)) is 1.14 in the formula (1) was taken as silsesquioxane derivative base polymer 2.

Formula 39

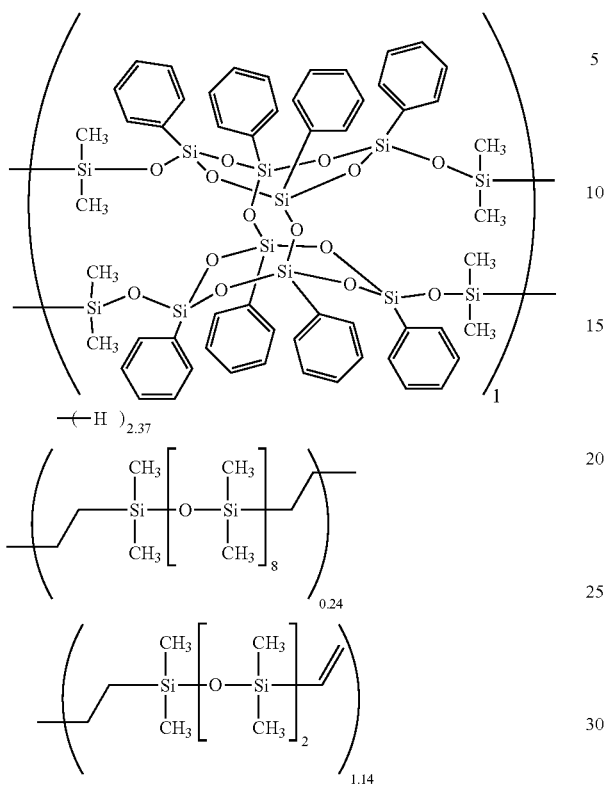

(B) Thermosetting Resin Having SiH Group as Obtained by Allowing Reaction Among Silsesquioxane Having SiH Group, Organopolysiloxane Having Two Alkenyl Groups, Epoxy Compound Having Alkenyl Group, and Silyl Compound Having Alkenyl Group Silsesquioxane Derivative Base Polymer 3

As the thermosetting resin having the SiH group, being component (B) of the invention, silsesquioxane derivative base polymer 3 represented by the formula below in which A (formula (a)) is 1.32, 2B (formula (b)) is 1.38, C (formula (c-i)) is 0.65 and D (formula (d-i)) is 0.65 in the formula (B1) described above was used.

Formula 40

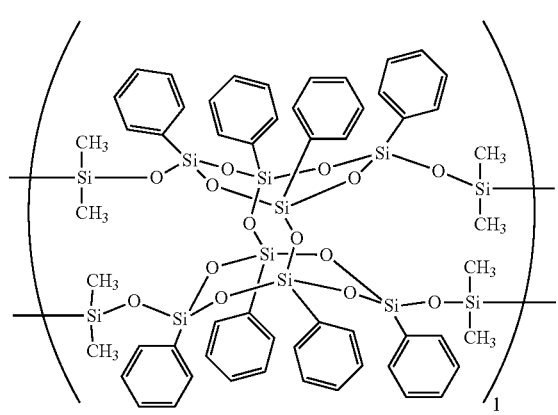

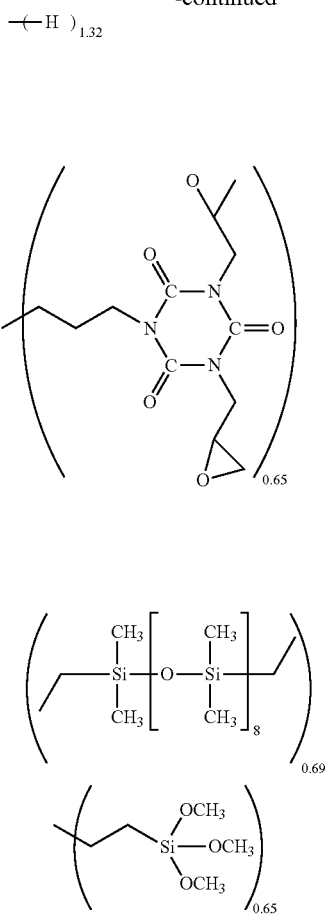

Silsesquioxane derivative base polymer 3 was prepared, according to the reaction formula below, by the method described below. In a reaction vessel having an inner volume of 300 mL equipped with a thermometer, a reflux condenser and a stirrer, 50 g of a silsesquioxane derivative (DD-4H), 18.6 g (0.0266 mol) of vinyl silicone (FM-2205), 7.47 g (0.0252 mol) of monoallyldiepoxy isocyanurate (MA-DGIC), 3.7 g (0.0252 mol) of S210 and 50 g of toluene as a solvent were put.

Under a nitrogen atmosphere, heating and stirring were started. The content in the vessel reached 100° C., and then Pt was added to be 1 ppm in a Pt concentration relative to DD-4H, and heating and stirring were continued as it was for 5 hours. The reaction was terminated after confirming that MA-DGIC was lost by GC. The resulting mixture was cooled to room temperature, and then 1.6 g of activated carbon was added thereto and the resulting mixture was stirred for 3 hours or more, and then the activated carbon was removed by filtration. Toluene being a solvent was distilled off from a filtrate by an evaporator at 90° C. under a reduced pressure conditions of 0.13 kPa. Thus, 74 g of colorless transparent liquid in a starch syrup was obtained.

When a molecular weight of a product obtained was analyzed by GPC, the number average molecular weight: Mn was 3,900 and the weight average molecular weight: Mw was 18,200.

Formula 41

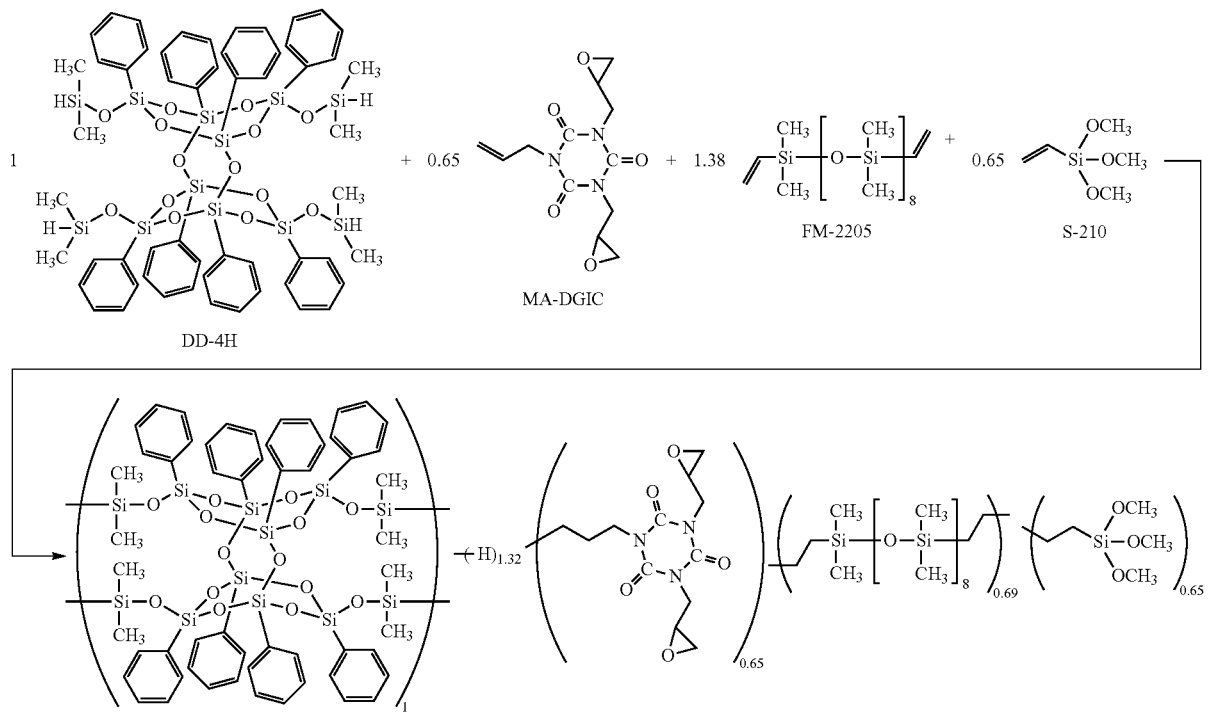

(C) Linear Organopolysiloxane Compound Having SiH Group Only at One Terminal

As organopolysiloxane having an SiH group only at one terminal, being component (B) of the invention, silicone having an SiH group only at one terminal and having the number average molecular weight of 900 or 500 made by JNC Corporation was used. Moreover, as a comparative compound of component (C), silicone having SiH groups at both terminals and having the number average molecular weight of 500 was used.

The organopolysiloxane having the SiH group only at one terminal and having the number average molecular weight of 900 or 500 was prepared with referring to the method disclosed in JP 2000-273178 A. Silicone having the SiH groups at both terminals and having the number average molecular weight of 500 was prepared with referring to the method disclosed in JP 2003-252995 A.

One-Terminal SiH Silicone Having Number Average Molecular Weight of 900

A compound represented by a chemical formula below in which $R^6$ is butyl, $R^7$ is methyl and m is 11 in the formula (2) was taken as one-terminal SiH silicone having the number average molecular weight of 900.

Formula 42

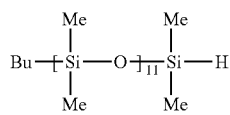

One-Terminal SiH Silicone Having Number Average Molecular Weight of 500

A compound represented by a chemical formula below in which $R^6$ is butyl, $R^7$ is methyl and m is 5 in the formula (2) was taken as one-terminal SiH silicone having the number average molecular weight of 500.

Formula 43

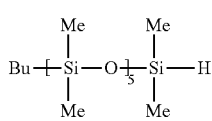

Both-Terminal SiH Silicone Having Number Average Molecular Weight of 500

As the comparative compound relative to component (C) according to the invention, both-terminal SiH silicone having the number average molecular weight of 500 as represented by a chemical formula below was used.

Formula 44

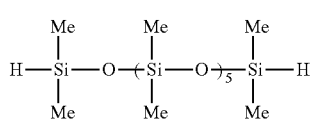

(D) Pt Catalyst

As a Pt catalyst being component (D) in the invention, a Karstedt catalyst (trade name Pt-VTS) 3 wt % xylene solution (made by Umicore N.V.) was used.

(E) Organopolysiloxane Compound Having Two or More Alkenyl Groups

As a compound having two or more alkenyl groups, being component (E) according to the invention, both-terminal vinyl silicone represented by a chemical formula below and having the number average molecular weight of 700 was in which $R^8$ is methyl, $R^9$ is methyl and n is 8 in the formula (3).

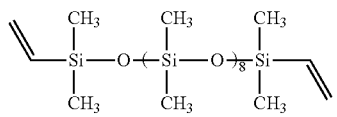

Formula 45

Epoxy Group-Containing Silane Coupling Agent

Moreover, in Comparison Example, as an adhesion promoter, glycidyl ether trimethoxysilane under a trade name of S510 (made by JNC Corporation) was used as an epoxy group-containing silane coupling agent.

Preparation of a Thermosetting Resin Composition

The compound prepared in Examples described above or a mixture of polyorganosiloxane was put in a screw vial. The screw vial was set to Planetary Centrifugal Mixer (Thinky Mixer (registered trademark) ARE-250, made by Thinky Corporation), and mixing and defoaming were performed.

A material obtained by diluting the Karstedt catalyst (trade name Pt-Vtx: 3 wt % xylene solution) made by Umicore N.V. 10 times with a hardening retarder: MVS-H (trade name, 1,3,5,7-tetravinyl-1,3,5,7-tetramethylcyclotetrasiloxane: made by JNC Corporation) was added to be a predetermined amount in a Pt concentration, and mixing and defoaming were performed again using Planetary Centrifugal Mixer to obtain compositions a to d being thermosetting resin compositions, and comparative compositions e to g, i and j. Table 1 shows mass percentage of each thermosetting resin composition.

Preparation of Filler-Containing Composition

Silica was dispersed as a filler into the thermosetting resin compositions described above to obtain compositions cs1 to cs3. Table 3 shows an amount (g) of blending the filler-containing compositions.

Silsesquioxane derivative base polymer 1, silsesquioxane derivative base polymer 3, one-terminal silicone having the number average molecular weight of 900, and silica were blended according to blending ratios shown in Table 3, using a three-roll mill, to prepare a thermosetting resin in which silica was dispersed in a nano order.

Then, both-terminal silicone having the molecular weight of 700 and a Pt catalyst were blended according to the blending ratios shown in Table 3, mixing and defoaming were performed again with the planetary centrifugal mixer to obtain thermosetting resin compositions as1 to as3.

In addition, silica used therein was as described below.

Silica I: fumed silica, hydrophilic type, mean primary particle size 7 nm, trade name: Aerosil #300 made by Nippon Aerosil Co., Ltd.

Silica II: fumed silica, hydrophilic type, mean primary particle size 12 nm, trade name: Reolosil QS102 made by Tokuyama Corporation.

Preparation of a Hardened Material

With regard to the thermosetting resin composition, Naflon SP packing (diameter 4 mm) made by NICHIAS Corporation was interposed as a spacer between two sheets of glass, a thermosetting resin composition was poured thereinto and defoamed under reduced pressure, and then heated at 80° C. for 1 hour, and then at 150° C. for 4 hours in the order, thereby hardening the composition, and the glass was pealed to obtain 4 mm-thick hardened materials a to d each having a smooth surface, and comparative hardened materials e to g, i and j.

Physical properties of hardened materials a to d and comparative hardened materials e to g, i and j obtained were evaluated by the methods described below. Table 2 shows the results.

Viscosity

Viscosity of a hardened material was measured using TV-22 type viscometer (cone-plate type) made by Toki Sangyo Co., Ltd. at 25° C. as a temperature of a constant-temperature bath.

Light Transmittance

Then, 4 mm-thick hardened materials were prepared, and light transmittance thereof at a wavelength of 400 nanometers was measured by UV-Vis Spectrophotometer UV-1650 made by Shimadzu Corporation.

Heat-Resistance Transmittance

A heat resistance test was conducted according to a method described below and evaluated. Then, 4 mm-thick hardened materials were prepared, and light transmittance thereof at a wavelength of 400 nanometers was measured by UV-Vis Spectrophotometer UV-1650 made by Shimadzu Corporation, and thus the measured value was taken as initial transmittance. The hardened materials were put in an oven at 180° C. (constant-temperature dryer: DX302 made by Yamato Scientific Co., Ltd.) and subjected to heat treatment for a fixed period of time (1,000 hours in Table 2).

Luminous transmittance of the hardened material after the heat resistance test was measured by the UV-Vis Spectrophotometer, and from transmittance at a wavelength of 400 nanometers, a retention ratio ((transmittance after heat treatment for a fixed period of time/initial transmittance at each wavelength)×100) at the wavelength was calculated and evaluated. With regard to the retention ratio of transmittance at the wavelength of 400 nanometers after 1,000 hours in the heat resistance test at 180° C., a case where the retention ratio was 85% or more was rated to be "good," a case where the retention ratio was 75% or more was rated to be "marginal," and a case where the retention ratio was 75% or less was rated to be "poor."

UV-Resistance Transmittance

With regard to UV-resistance transmittance, 4 mm-thick hardened materials were irradiated with UV light having an irradiation intensity of 550 to 600 mW/cm through a 365 nm band-pass filter by using Deep UV Lamp made by USHIO, Inc. A case where a retention ratio at 400 nm after irradiation of 2,000 hours was 99% or more was rated to be "good," a case where the retention ratio was 97% or more was rated to be "marginal," and a case where the retention ratio was 97% or less was rated to be "poor."

Refractive Index

A hardened material was cut using a bandsaw to prepare a test specimen in accordance with JIS K7142 (2008). A refractive index of the test specimen was measured using a D line (586 nm) of a sodium vapor lamp by an Abbe refractometer (NAR-2T made by ATAGO Co., Ltd.). As an intermediate liquid, methylene iodide was used.

Hardness

In accordance with specifications of JIS K6253 (2006), D hardness or A hardness was measured by Durometer WR-105D or Durometer WR-104A, made by Nishitokyo Seimitsu Co., Ltd.

Adhesion Strength Test PPA

A test was conducted in accordance with JIS K6850 (1999). A test specimen was prepared by interposing a thermosetting resin composition between materials as base materials prepared by adjusting a dimension of a polyphthalamide resin (Amodel (trade name) A-4122NLWH905 made by Solvay Advanced Polymers, L.L.C.) in accordance with JIS K6850 (1999), and allowing thermosetting under conditions of heating the resulting material at 80° C. for 1 hour and then at 150° C. for 1 hour. As an adhesion test, strength was measured using a load cell of 5 kN by a tensile compression tester (Autograph AGS-500B made by Shimadzu Corporation).

Adhesion Strength Test PA9T

A test was conducted in accordance with JIS K6850 (1999). A test specimen was prepared by interposing a thermosetting resin composition between materials as base materials prepared by adjusting a dimension of a polyphthalamide resin (Genestar PA9T (trade name) made by Kuraray Co., Ltd.) in accordance with JIS K6850 (1999), and allowing thermosetting under conditions of heating the resulting material at 80° C. for 1 hour and then at 150° C. for 1 hour. As an adhesion test, strength was measured using a load cell of 5 kN by a tensile compression tester (Autograph AGS-500B made by Shimadzu Corporation).

Adhesion Strength Test Ag

A test was conducted in accordance with JIS K6850 (1999). A specimen was prepared by interposing a thermosetting resin composition between silver-plated standard test substrates (made by Nippon Testpanel Co., Ltd.) as base materials, and allowing thermosetting under conditions of heating the resulting at 80° C. for 1 hour and then at 150° C. for 4 hours. An adhesion test was conducted using a 5 kN load cell with a tensile compression tester Autograph AGS-500B made by Shimadzu Corporation.

Moisture-Absorption Reflow Test

Into 16 pieces of PPA resin packages for high power LED subjected to silver plating on a bottom portion (Model Number 5050 D/G made by Enomoto Co., Ltd.), thermosetting resin compositions were poured by a dispenser (Model Number MPP-1 made by Musashi Engineering, Inc.), and then the compositions were subjected to thermosetting under conditions of heating the resulting material at 80° C. for 1 hour and then at 150° C. for 4 hours. The PPA resin packages were subjected to moisture absorption under conditions of a relative temperature of 30° C., a humidity of 60%, and 192 hours in an environmental test machine (Model Number SH-241 made by Espec Corporation), and passed through reflow twice using a simulation reflow furnace (Model Number SRS-1C made by Malcom Co., Ltd.) under temperature conditions (260° C.) in accordance with JEDEC standards. The number of pieces of peeling and the number of pieces of cracks generated in 16 pieces were shown.

Heat Cycle Test, PPA, Peeling and Cracks

Into 16 pieces of PPA resin packages for high power LED subjected to silver plating on a bottom portion (Model Number 5050 D/G made by Enomoto Co., Ltd.), thermosetting resin compositions were poured by a dispenser (Model Number MPP-1 made by Musashi Engineering, Inc.), and then the compositions were subjected to thermosetting under conditions of heating the resulting material at 80° C. for 1 hour and then at 150° C. for 4 hours. The PPA resin packages were passed through reflow once using a simulation reflow furnace (Model Number SRS-1C made by Malcom Co., Ltd.) under temperature conditions (260° C.) in accordance with JEDEC standards. Then, the packages were put into a test area of cold impact tester (Model Number TSE-11, made by ESPEC Corporation), and tested by repeating 500 cycles by taking as one cycle exposure at −40° C. for 30 minutes, and at 150° C. for 30 minutes. In addition, the test was conducted by adjusting transfer time to be 2 minutes between both exposure temperatures. Generation of peeling and cracks was observed by a microscope. A fraction defective in 16 pieces is presented.

Heat Cycle Test, PA9T, Peeling and Cracks

Into 15 pieces of PA9T resin packages for high power LED subjected to silver plating on a bottom portion (Model Number SMD5050N-TA112 made by I-Chiun Precision Industry Co., Ltd.), thermosetting resin compositions were poured by a dispenser (Model Number MPP-1 made by Musashi Engineering, Inc.), and then the compositions were subjected to thermosetting under conditions of heating the resulting material at 80° C. for 1 hour and then at 150° C. for 4 hours. The PA9T resin packages were passed through reflow once using a simulation reflow furnace (Model Number SRS-1C made by Malcom Co., Ltd.) under temperature conditions (260° C.) in accordance with JEDEC standards. Then, the packages were put into a test area of cold impact tester (Model Number TSE-11, made by ESPEC Corporation), and tested by repeating 500 cycles by taking as one cycle exposure at −40° C. for 30 minutes, and at 150° C. for 30 minutes. In addition, the test was conducted by adjusting transfer time to be 2 minutes between both exposure temperatures. Generation of peeling and cracks was observed by a microscope. A fraction defective in 15 pieces is presented.

Heat Cycle Test, Wire Cutting

Into 32 pieces of LED resin packages (Model Number 5050 D/G made by Enomoto Co., Ltd.) each mounted with a blue LED chip (Model Number B1515ACA0 made by GeneLite Inc.) and a gold wire (Model Number SR-25 made by Tanaka Kikinzoku Kogyo K. K.), thermosetting resin compositions were poured by a dispenser (Model Number MPP-1 made by Musashi Engineering, Inc.), and then the compositions were subjected to thermosetting under conditions of heating the resulting material at 80° C. for 1 hour and then at 150° C. for 4 hours. The LED resin packages were passed through reflow once using a simulation reflow furnace (Model Number SRS-1C made by Malcom Co., Ltd.) under temperature conditions (260° C.) in accordance with JEDEC standards. Then, the packages were put into a test area of cold impact tester (Model Number TSE-11, made by ESPEC Corporation), and tested by repeating 500 cycles by taking as one cycle exposure at −40° C. for 30 minutes, and at 150° C. for 30 minutes. In addition, the test was conducted by adjusting transfer time to be 2 minutes between both exposure temperatures. Then, LEDs were lit. Tables 2 and 4 show a lighting fraction defective.

Sulfur Resistance

Into 16 pieces of PPA resin packages for high power LED subjected to silver plating on a bottom portion (Model Number 5050 D/G made by Enomoto Co., Ltd.), thermosetting resin compositions were poured by a dispenser (Model Number MPP-1 made by Musashi Engineering, Inc.), and then the compositions were subjected to thermosetting under conditions of heating the resulting material at 80° C. for 1 hour and then at 150° C. for 4 hours. The PPA packages were put in a glass container in which 0.2 g of sulfur powder was put. A state of discoloration (blackening) of the PPA resin packages was observed after heating at 60° C. for 100 hours. Image processing was applied and a discoloration ratio of silver on a package bottom portion was presented.

TABLE 1

| | | Composition | | | | Comparative composition | | | |
|---|---|---|---|---|---|---|---|---|---|
| | | a | b | c | d | e | f | g | i |
| (A) | Silsesquioxane derivative base polymer 1 (mass %) | 89.2 | 89.2 | 85.8 | 85.8 | 90.0 | 84.0 | 78.0 | — |
| | Silsesquioxane derivative base polymer 2 (mass %) | — | — | — | — | — | — | — | 84.0 |
| (B) | Silsesquioxane derivative base polymer 3 (mass %) | 3.0 | 3.0 | 3.0 | 3.0 | — | — | — | — |
| (C) | One-terminal SiH silicone having molecular weight of 900 (mass %) | 7.8 | — | 7.5 | — | — | — | — | — |
| | One-terminal SiH silicone having molecular weight of 500 (mass %) | — | 7.8 | — | 7.5 | — | — | — | — |
| | Both-terminal vinyl silicone having molecular weight of 700 (mass %) | — | — | 3.7 | 3.7 | 9.0 | 15.0 | 21.0 | 15.0 |
| | Both-terminal vinyl silicone having molecular weight of 500 (mass %) | | | | | — | — | — | — |
| (D) | Pt catalyst (ppm) | 0.1 | 0.1 | 0.5 | 0.5 | 1 | 1 | 1 | 1 |
| | Epoxy group-containing silane coupling agent (mass %) | — | — | — | — | 1 | 1 | 1 | 1 |

TABLE 2

| | | Hardened material | | | | Comparative hardened material | | | |
|---|---|---|---|---|---|---|---|---|---|
| | | a | b | c | d | e | f | g | i |
| Viscosity (mPa · s/25° C.) | | 8,500 | 5,500 | 4,500 | 3,000 | 3,000 | 2,500 | 1,800 | 3,000 |
| Light transmittance (%) | | 98 | 98 | 98 | 98 | 99 | 98 | 96 | 98 |
| Heat-resistance transmittance | | Good | Good | Good | Good | Good | Marginal | Poor | Good |
| UV-resistance transmittance | | Good | Good | Good | Good | Good | Marginal | Poor | Good |
| Refractive index | | 1.51 | 1.51 | 1.51 | 1.51 | 1.51 | 1.49 | 1.48 | 1.5 |
| Hardness | D hardness | 35 | 25 | 25 | 15 | 60 | 45 | 17 | 35 |
| | A hardness | 90 | 80 | 75 | 60 | — | — | 66 | 81 |
| Adhesion strength test PPA (MPa) | | 3 | 2.5 | 2.4 | 2 | 3.5 | 2 | 1 | 1.5 |
| Adhesion strength test PA9T (MPa) | | 4 | 3 | 3.7 | 2.5 | 2 | 1.5 | 0.5 | 1.2 |
| Adhesion strength test Ag (MPa) | | 2.5 | 1.8 | 2 | 1 | 3 | 1.7 | 0.1 | 0.8 |
| Moisture-absorption reflow | Number of pieces of peeling | 0 | 0 | 0 | 0 | 2 | 15 | 15 | 13 |
| | Number of pieces of cracks | 0 | 0 | 0 | 0 | 3 | 7 | 13 | 5 |
| Heat cycle test PPA fraction defective (%) | | 0 | 0 | 0 | 0 | 100 | 100 | 100 | 100 |
| Heat cycle test PA9T fraction defective (%) | | 0 | 0 | 0 | 0 | 100 | 100 | 100 | 100 |
| Heat cycle test Lighting fraction defective (%) | | 0 | 0 | 0 | 0 | 100 | 100 | 100 | 20 |
| Sulfur resistance Discoloration ratio | | 2 | 10 | 5 | 15 | 1 | 30 | 80 | 50 |

TABLE 3

| | | Composition | | |
|---|---|---|---|---|
| | | cs1 | cs2 | cs3 |
| (A) | Silsesquioxane derivative base polymer 1 (mass %) | 85.8 | 85.8 | 85.8 |
| | Silsesquioxane derivative base polymer 2 (mass %) | — | — | — |
| (B) | Silsesquioxane derivative base polymer 3 (mass %) | 3 | 3 | 3 |
| (C) | One-terminal SiH silicone having weight of 900 (mass %) | 7.5 | 7.5 | 7.5 |
| | Both-terminal vinyl silicone having molecular weight of 700 (mass %) | 3.7 | 3.7 | 3.7 |
| | Silica I | 1 | — | — |
| | Silica II | — | 1 | 3 |
| (D) | PT catalyst (ppm) | 0.5 | 0.5 | 0.5 |

TABLE 4

| | | Hardened material | | |
|---|---|---|---|---|
| | | cs1 | cs2 | cs3 |
| Refractive index | | 1.51 | 1.51 | 1.51 |
| Hardness | D hardness | 30 | 31 | 37 |
| | A hardness | 80 | 82 | 85 |
| Adhesion strength test PPA (MPa) | | 3 | 3.1 | 3.1 |
| Adhesion strength test PA9T (MPa) | | 3.5 | 3.7 | 3.7 |
| Adhesion strength test Ag (MPa) | | 2 | 2 | 2.1 |
| Moisture-absorption reflow | Number of pieces of peeling | 0 | 0 | 0 |
| | Number of pieces of cracks | 0 | 0 | 0 |
| Heat cycle test PPA, fraction defective (%) | | 0 | 0 | 0 |
| Heat cycle test PA9T, fraction defective (%) | | 0 | 0 | 0 |
| Heat cycle test, lighting fraction defective (%) | | 0 | 0 | 0 |
| Sulfur resistance, discoloration ratio | | 3 | 3 | 2 |

As is presented in Table 2, hardened materials a, b, c and d prepared by using compositions a, b, c and d according to the invention were found to have a low hardness as low as A90 or lower in the hardness, and the refractive index of 1.5 or more, further to retain the heat-resistance transmittance and the UV-resistance transmittance of silsesquioxane, and to have good adhesion with the polyphthalamide resin (PPA, PA9T) being a reflector base material, or silver, and further to be excellent in the moisture-absorption resistance reflow, the heat cycle resistance and the sulfur resistance.

In contrast, with regard to comparison hardened material e prepared by using comparative composition with using neither the thermosetting resin having the SiH group as obtained by allowing reaction among the silsesquioxane having the SiH group, the organopolysiloxane having two alkenyl groups, the epoxy compound having the alkenyl group, and the silyl compound having the alkenyl group, nor the organopolysiloxane compound having the SiH group only at one terminal according to the invention, while the adhesion was high, the hardness was too high to have no heat cycle resistance. Moreover, in comparative hardened material g prepared using comparative compound g, the hardness decreased only to D45. Furthermore, the heat resistance thereof deteriorated. In comparative hardened material g prepared by using comparative compound g, the hardness decreased to 66 in terms of A hardness, but both the heating resistance and the UV resistance thereof deteriorated, and the adhesion also deteriorated.

As is presented in Table 4, the compositions into which silica was dispersed according to the invention were also found to have a low hardness as low as A90 or lower, and the refractive index of 1.5 or more, and good adhesion with the polyphthalamide resin (PPA, PA9T) and to be excellent in the moisture-absorption resistance reflow and the heat cycle resistance. Furthermore, the compositions are in a state in which silica is dispersed in the nano order to contribute to capability of prevention of phosphor sedimentation, efficient light extraction and decrease of color fluctuation.

Although the invention has been described in detail using specific embodiments, it is clear that numerous changes and modifications are possible for those skilled in the art without departing from the spirit and scope of the invention. In addition, the application is based on Japanese patent application (application for patent 2012-249311) filed on Nov. 13, 2012, which is entirely herein incorporated by reference.

INDUSTRIAL APPLICABILITY

A thermosetting resin composition according to the invention has a high heat resistance and high UV resistance, and a high adhesion with a substrate and excellent toughness, and therefore gives a hardened material having excellent moisture-absorption reflow resistance and heat cycle resistance, and thus the composition is significantly useful particularly as a sealing material of an optical semiconductor device such as a high power LED.

The invention claimed is:

1. A thermosetting resin composition containing (A) to (D) below:
   (A) a thermosetting resin containing an SiH group and an alkenyl group, the thermosetting resin being a reaction product between silsesquioxane having the SiH group and organopolysiloxane having two alkenyl groups;
   (B) a thermosetting resin having an SiH group obtained by allowing reaction among silsesquioxane having an SiH group, organopolysiloxane having two alkenyl groups, an epoxy compound having an alkenyl group and a silyl compound having an alkenyl group;
   (C) a linear organopolysiloxane compound having an SiH group only at one terminal; and
   (D) a Pt catalyst.

2. The thermosetting resin composition according to claim 1, wherein the silsesquioxane is a double decker silsesquioxane.

3. The thermosetting resin composition according to claim 1, further containing an organopolysiloxane compound (E) having two or more alkenyl groups.

4. The thermosetting resin composition according to claim 1, wherein thermosetting resin (A) is a compound represented by formula (1) below:

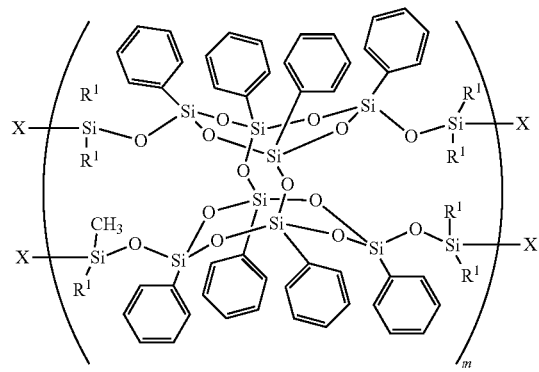

(1)

wherein, in formula (1), X is each independently
a group represented by formula (X-I), formula (X-II) or formula (X-III) described below, and when the number of groups represented by formula (X-I) per molecule of the compound represented by formula (1) (average in one molecule of the compound when the compound is a mixture of compounds in which a ratio of a group represented by formula (X-I), a ratio of a group represented by formula (X-II) and a ratio of a group represented by formula (X-III) are different) is taken as a, the number of groups represented by formula (X-II) is taken as b, and the number of groups represented by formula (X-III) is taken as c, expressions: a+2b+c=4, 0<a≤3, 0≤b≤1 and 0<c≤3 hold, and $R^1$ is each independently a group selected from alkyl having 1 to 4 carbons, cyclopentyl and cyclohexyl, and m is a mean value satisfying 1 to 100;

—H  (X-I)

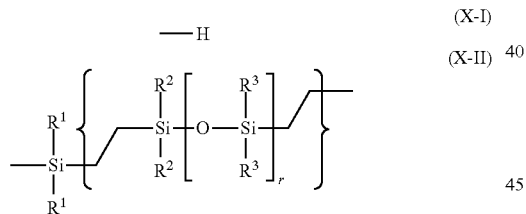

(X-II)

wherein, in formula (X-II), $R^2$ and $R^3$ are each independently a group selected from alkyl having 1 to 4 carbons, cyclopentyl, cyclohexyl and phenyl, r is the number of repetitions of —OSi$(R^3)_2$—, and r is a mean value satisfying 2 to 20;

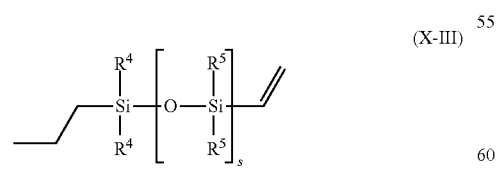

(X-III)

wherein, in formula (X-III), $R^4$ and $R^5$ are each independently a group selected from alkyl having 1 to 4 carbons, cyclopentyl, cyclohexyl and phenyl, s is the number of repetitions of —OSi$(R^5)_2$—, and s is a mean value satisfying 2 to 20.

5. The thermosetting resin composition according to claim 1, wherein thermosetting resin (B) is a compound represented by formula (B1) below:

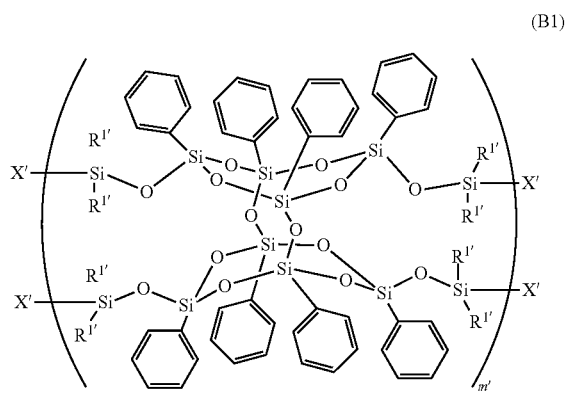

(B1)

wherein, in formula (B1), X' is each independently a group represented by formula (a), formula (b), formula (c-i), formula (c-ii), formula (c-iii), formula (d-i), formula (d-ii) or formula (d-iii) below, and when the number of groups represented by formula (a) is taken as A, the number of groups represented by formula (b) is taken as B, the number of groups represented by formula (c-i), formula (c-ii) or (c-iii) is taken as C, and the number of groups represented by formula (d-i), formula (d-ii) or formula (d-iii) as D per molecule of the compound represented by formula (B1) (average in one molecule of the compound when the compound is a mixture of compounds in which a ratio of the group represented by formula (a) and ratios of the groups represented by formula (b) to formula (d-iii) are different), expressions: A+2B+C+D=4, 0.5≤A≤3.0, 0.5≤2B≤2.0, 0.1≤C≤2 and 0≤D≤1.0 hold, $R^{1'}$ is each independently a group selected from alkyl having 1 to 4 carbons, cyclopentyl and cyclohexyl, and m' is a mean value satisfying 1 to 100;

—H  (a)

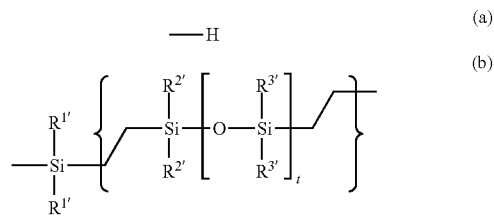

(b)

wherein, in formula (b), $R^{2'}$ and $R^{3'}$ are each independently a group selected from alkyl having 1 to 4 carbons, cyclopentyl, cyclohexyl and phenyl, t is the number of repetitions of —OSi$(R^{3'})_2$—, and is a mean value satisfying 1 to 20;

(c-i)

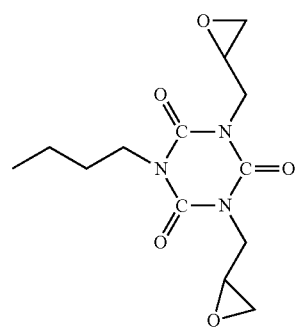

(c-ii)

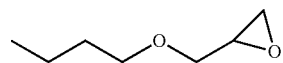

(c-iii)

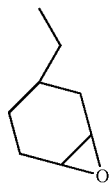

(d-i)

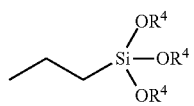

(d-ii)

(d-iii)

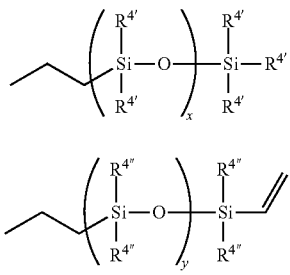

wherein, in formulas (d-i) to (d-iii), $R^4$, $R^{4'}$ and $R^{4''}$ are each independently a group selected from methyl, ethyl, butyl and isopropyl, x is the number of repetitions of $-OSi(R^{4'})_2-$, and is a mean value satisfying 1 to 20, y is the number of repetitions of $-OSi(R^{4''})_2-$, and is a mean value satisfying 1 to 10.

6. The thermosetting resin composition according to claim 1, wherein thermosetting resin (B) is a compound represented by formula (B2) below:

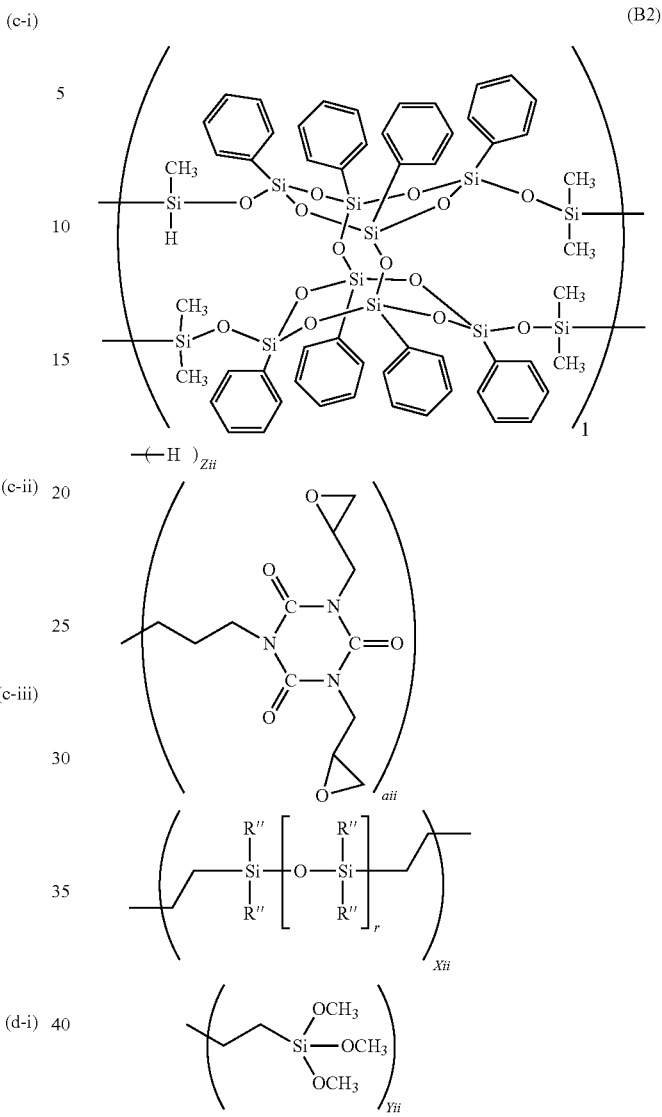

wherein, in formula (B2), R″ is each independently a group selected from alkyl having 1 to 4 carbons, cyclopentyl, cyclohexyl and phenyl, r is an integer of 0 to 100; aii is a subscript satisfying expressions: $0.1 \leq aii \leq 3.5$, Xii is a subscript satisfying expressions: $0 \leq 2Xii \leq 2.0$, Yii is a subscript satisfying expressions: $0 \leq Yii \leq 3.0$, and Zii is a subscript satisfying expressions: $0.1 \leq Zii \leq 3.5$, wherein $aii+2Xii+Yii+Zii=4$.

7. The thermosetting resin composition according to claim 1, wherein linear organopolysiloxane (C) having an SiH group only at one terminal is a compound represented by formula (2) below:

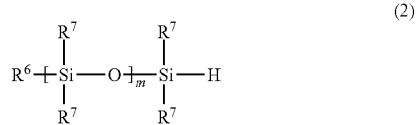

wherein, $R^6$ and $R^7$ are each independently a group selected from alkyl having 1 to 4 carbons, cyclopentyl and cyclohexyl, and m is the number of repetitions of —OSi($R^7$)$_2$—, and is a mean value satisfying 1 to 20.

8. The thermosetting resin composition according to claim 3, wherein organopolysiloxane compound (E) having two or more alkenyl groups is a compound represented by formula (3):

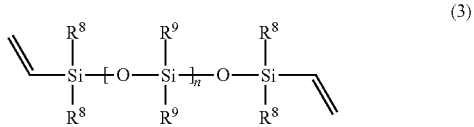

(3)

wherein, in formula (3), $R^8$ and $R^9$ are each independently a group selected from alkyl having 1 to 4 carbons, cyclopentyl, cyclohexyl and phenyl, and n is the number of repetitions of —OSi($R^9$)$_2$—, and is a mean value satisfying 1 to 50.

9. The thermosetting resin composition according to claim 1, wherein based on the total amount of the thermosetting resin composition, a ratio of blending thermosetting resin (A) is 50 to 95% by mass, a ratio of blending thermosetting resin (B) is 1 to 50% by mass and a ratio of blending linear organopolysiloxane compound (C) is 2 to 20% by mass.

10. The thermosetting resin composition according to claim 3, optionally containing 1 to 10% by mass of the organopolysiloxane compound (E) based on the total amount of thermosetting resin composition.

11. The thermosetting resin composition according to claim 1, wherein at least one of silica and a phosphor is further dispersed thereinto.

12. A hardened material, obtained by hardening the thermosetting resin composition according to claim 1.

13. A composition for an optical semiconductor, containing the thermosetting resin composition according to claim 1.

14. An optical semiconductor device, including as a sealing agent the composition for the optical semiconductor according to claim 13.

* * * * *